(12) United States Patent
Dutta et al.

(10) Patent No.: US 11,749,746 B2
(45) Date of Patent: Sep. 5, 2023

(54) RADIO FREQUENCY FRONT END (RFFE) HETERO-INTEGRATION

(71) Applicant: QUALCOMM Incorporated, San Diego, CA (US)

(72) Inventors: Ranadeep Dutta, Del Mar, CA (US); Jonghae Kim, San Diego, CA (US); Je-Hsiung Lan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 22 days.

(21) Appl. No.: 17/244,293

(22) Filed: Apr. 29, 2021

(65) Prior Publication Data

US 2022/0352359 A1    Nov. 3, 2022

(51) Int. Cl.
| | |
|---|---|
| *H01L 29/737* | (2006.01) |
| *H01L 23/14* | (2006.01) |
| *H01L 23/498* | (2006.01) |
| *H01L 23/00* | (2006.01) |
| *H01L 29/205* | (2006.01) |
| *H01L 29/66* | (2006.01) |

(52) U.S. Cl.
CPC ........ *H01L 29/7371* (2013.01); *H01L 23/147* (2013.01); *H01L 23/49844* (2013.01); *H01L 24/08* (2013.01); *H01L 24/80* (2013.01); *H01L 29/205* (2013.01); *H01L 29/66318* (2013.01); *H01L 2224/08165* (2013.01); *H01L 2224/80001* (2013.01)

(58) Field of Classification Search
CPC ............... H01L 29/7371; H01L 23/147; H01L 23/49844; H01L 24/08; H01L 24/80; H01L 29/205; H01L 29/66318; H01L 2224/08165; H01L 2224/80001
See application file for complete search history.

(56) References Cited

U.S. PATENT DOCUMENTS

| | | |
|---|---|---|
| 2004/0195588 A1 | 10/2004 | Hase |
| 2014/0209926 A1 | 7/2014 | Takatani et al. |
| 2018/0233604 A1 | 8/2018 | Gu et al. |

(Continued)

FOREIGN PATENT DOCUMENTS

| | | | |
|---|---|---|---|
| CN | 210897278 U | * | 6/2020 |
| JP | 2017191865 A | * | 10/2017 |
| WO | 2017111769 A1 | | 6/2017 |

OTHER PUBLICATIONS

Milton; Device Technologies for RF Front-End Circuits in Next-Generation Wireless Communications; Proc. of the IEEE, vol. 92, No. 2, 2004; pp. 354-375 (Year: 2004).*

(Continued)

*Primary Examiner* — Syed I Gheyas
(74) *Attorney, Agent, or Firm* — QUALCOMM INCORPORATED

(57) ABSTRACT

In an aspect, a heterojunction bipolar transistor (HBT) includes a sub-collector disposed on a collector. The collector has a collector contact disposed on the sub-collector and located on a first side of the heterojunction bipolar transistor. The HBT includes an emitter disposed on an emitter cap. The emitter has an emitter contact disposed on the emitter cap and located on a second side of the heterojunction bipolar transistor. The HBT includes a base having a base contact located on the second side of the heterojunction bipolar transistor.

26 Claims, 16 Drawing Sheets

(56) References Cited

U.S. PATENT DOCUMENTS

2018/0309417 A1    10/2018   Obu et al.
2019/0341381 A1    11/2019   Dutta et al.
2022/0093492 A1*   3/2022   Elsherbini ........... H01L 23/5385

OTHER PUBLICATIONS

International Search Report and Written Opinion—PCT/US2022/071374—ISA/EPO—dated Jul. 12, 2022.

* cited by examiner

RADIO FREQUENCY FRONT END (RFFE) HETERO-INTEGRATION

BACKGROUND OF THE DISCLOSURE

1. Field of the Disclosure

Aspects of this disclosure relate generally to integrated circuit (IC) fabrication, and particularly to radio frequency front end (RFFE) hetero-integration with Indium Phosphide (InP) on Silicon (Si) to reduce a size of a base collector junction area.

2. Description of the Related Art

In a semiconductor (also known as a chip or integrated circuit (IC)), at the power amplifier stage or the low noise amplifier stage, power gain decreases as frequency increases, typically about 15 decibels (dB) per decade of frequency. When the frequency goes above 70 Gigahertz (GHz), particularly 100 GHz and beyond, semiconductors have difficulty providing power gain.

Indium phosphide (InP) is one of the few technologies that can provide adequate power gains beyond 100 GHz (e.g., particularly 140 Ghz and above). However, the base collector junction area of an InP heterojunction bipolar transistor (HBT) has a size large enough to accommodate the base contact surrounding the emitter, to reduce the base resistance. The resulting large base collector junction area leads to reduced gain, particularly at higher frequencies. In addition, the large base collector junction area increases the form factor. Semiconductors are typically hetero-integrated on the other side of an antenna tile. In hetero-integration, chips that are functionally different and that use different processes are stacked into a complete system, such as a system-on-a-chip (SOC).

As frequency increases, size of antenna tiles decreases. For example, near 70 GHz and above, an antenna tile becomes smaller than the chip on the other side, thereby resulting in unused laminate space. Thus, as frequencies increase and antenna tiles become smaller, the wasted space increases due to the size of the base collector junction area because in a conventional HBT transistor, the base contact is on the same side as the collector contact and the emitter contact.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In a first aspect, an apparatus includes a heterojunction bipolar transistor (HBT). The HBT includes a sub-collector disposed on a collector. The collector has a collector contact disposed on the sub-collector and located on a first side of the heterojunction bipolar transistor. The HBT includes an emitter disposed on an emitter cap. The emitter has an emitter contact disposed on the emitter cap and located on a second side of the heterojunction bipolar transistor. The HBT includes a base having a base contact located on the second side of the heterojunction bipolar transistor.

In a second aspect, a method of fabricating a heterojunction bipolar transistor (HBT) includes forming a sub-collector and forming a collector on the sub-collector. The collector has a collector contact disposed on the sub-collector and located on a first side of the heterojunction bipolar transistor. The method includes forming an emitter and forming an emitter cap on the emitter. The emitter has an emitter contact disposed on the emitter cap and located on a second side of the heterojunction bipolar transistor. The method includes forming a base having a base contact located on the second side of the heterojunction bipolar transistor.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof. A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
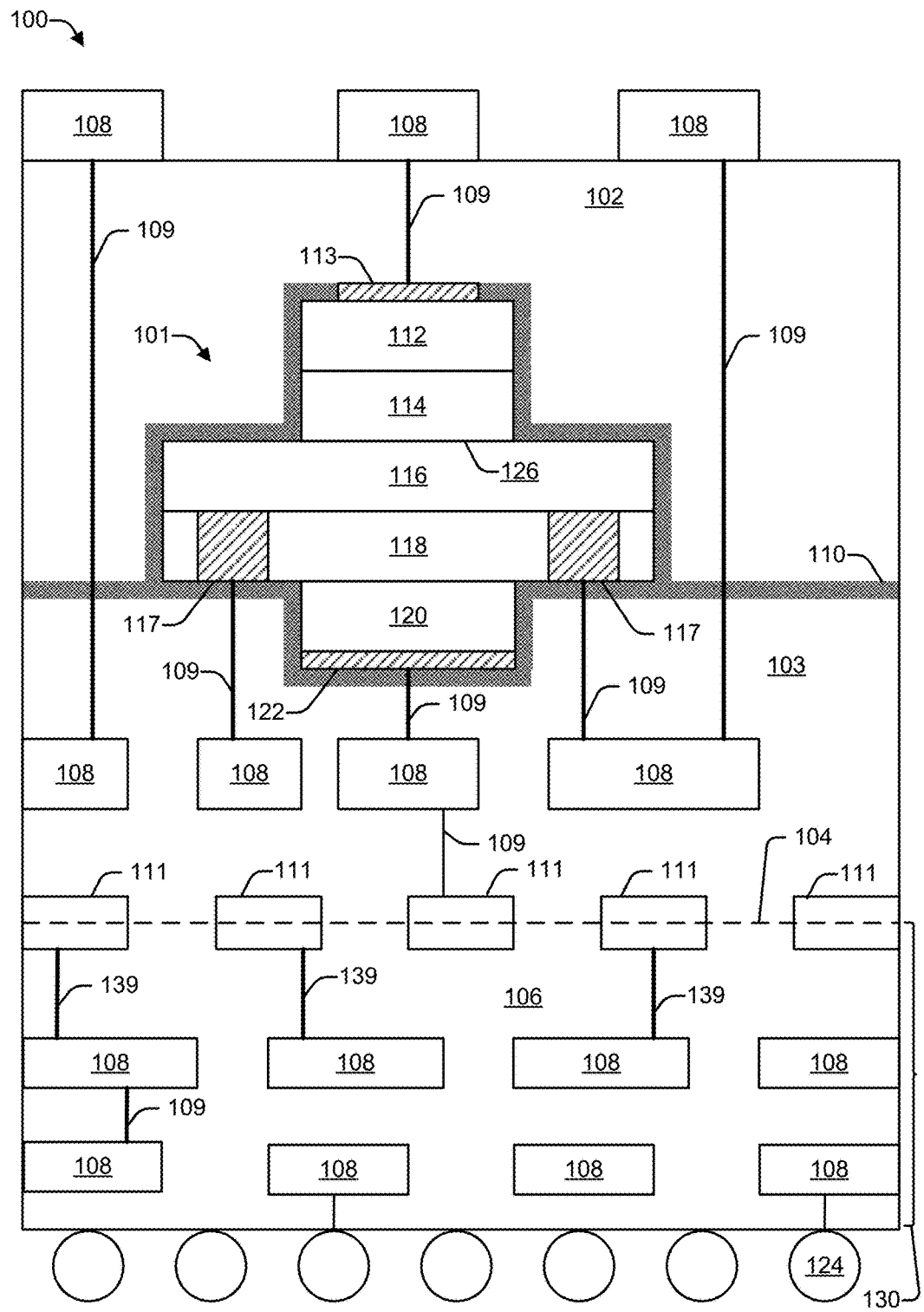
FIG. 1 illustrates an exemplary cross-section of a semiconductor structure with a backside collector contact, according to various aspects of the disclosure.

Disclosed are systems and techniques to reduce a base collector junction area of a heterojunction bipolar transistor (HBT) by moving a collector contact to the opposite side of an emitter contact and a base contact. Technical advantages of this include, for example, reducing the base collector junction area by about 30% and increasing power gain by about 2 decibels (db). A first mesa is used on an emitter-to-base side and a second mesa is used on a collector-to-base side. Various aspects are disclosed for hetero-integrating an HBT wafer (e.g., that includes Indium Phosphide (InP)) including using either (1) a sacrificial wafer or (2) a Silicon (Si) interposer on a backside.

In one aspect, a sacrificial wafer is bonded to the HBT wafer to provide mechanical stability during the process to create the chip. After the process is complete, the sacrificial wafer is de-bonded. After dicing, chiplets (also referred to as a die) may be separately hetero-integrated on either side of the silicon wafer.

In another aspect, a Si interposer is used to interconnect HBTs created on the 300 millimeter (mm) Si wafer to chiplets on the other side. A chiplet is an integrated circuit block that has been designed to work with other chiplets to form larger more complex chips. For example, a conventional chip is subdivided into functional circuit blocks, called chiplets. Thus, chiplets refer to the independent constituents which make up a large chip built out of multiple smaller dies. The Si interposer provides mechanical stability during the process and enables base and collector contacts and interconnects to be provided. The SI interposer may be used for hetero-integrating chips on the other side. For example, after the process is complete, hetero-integration may be performed with the InP-on-Si wafer on one side and chiplets on the other side of the Si interposer.

The systems and techniques described herein differ from a conventional InP structure in several ways. First, unlike a conventional semiconductor in which collector contacts are on the same side as the base contacts and the emitter contacts, the systems and techniques provide (e.g., on a 300 mm Si substrate) collector contacts on an opposite side of the base contacts and the emitter contacts. Second, the systems and techniques provide a mesa on both the emitter side and the collector side. A mesa is an area on a semiconductor wafer where the semiconductor has not been etched away, thereby creating a flat-topped protrusion. In contrast, in a conventional semiconductor, the mesa is only on the emitter side. Third, the systems and techniques enable hetero-integration. Conventionally, separate bonded wafer or interconnects are not provided. The systems and techniques use a Si interposer that is bonded on the emitter side with chiplets on the other side. The advantages of the systems and techniques described herein include about 30% reduction in base collector junction area, a 2 dB power gain increase (e.g., at 100 gigahertz (GHz)), lower cost, and a wafer scalable to 300 mm (e.g., because of the use of a Si substrate).

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "example" and/or "example" are used herein to mean "serving as an example, instance, or illustration." Any aspect described herein as "example" and/or "example" is not necessarily to be construed as preferred or advantageous over other aspects. Likewise, the term "aspects of the disclosure" does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

As used herein, the terms "user equipment" (UE) and "base station" are not intended to be specific or otherwise limited to any particular radio access technology (RAT), unless otherwise noted. In general, a UE may be any wireless communication device (e.g., a mobile phone, router, tablet computer, laptop computer, consumer asset tracking device, wearable device (e.g., smartwatch, glasses, augmented reality (AR)/virtual reality (VR) headset, etc.), vehicle (e.g., automobile, motorcycle, bicycle, etc.), Internet of Things (IoT) device, etc.) used by a user to communicate over a wireless communications network. A UE may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile device," a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, wireless local area network (WLAN) networks (e.g., based on Institute of Electrical and Electronics Engineers (IEEE) 802.11, etc.) and so on.

A base station may operate according to one of several RATs in communication with UEs depending on the network in which it is deployed, and may be alternatively referred to as an access point (AP), a network node, a NodeB, an evolved NodeB (eNB), a next generation eNB (ng-eNB), a New Radio (NR) Node B (also referred to as a gNB or gNodeB), etc. A base station may be used primarily to support wireless access by UEs, including supporting data, voice, and/or signaling connections for the supported UEs. In some systems a base station may provide purely edge node signaling functions while in other systems it may provide additional control and/or network management functions. A communication link through which UEs can send RF signals to a base station is called an uplink (UL) channel (e.g., a reverse traffic channel, a reverse control channel, an access channel, etc.). A communication link through which the base station can send RF signals to UEs is called a downlink (DL) or forward link channel (e.g., a paging channel, a control channel, a broadcast channel, a forward traffic channel, etc.). As used herein the term traffic channel (TCH) can refer to either an uplink/reverse or downlink/forward traffic channel.

The term "base station" may refer to a single physical transmission-reception point (TRP) or to multiple physical TRPs that may or may not be co-located. For example, where the term "base station" refers to a single physical TRP, the physical TRP may be an antenna of the base station corresponding to a cell (or several cell sectors) of the base station. Where the term "base station" refers to multiple co-located physical TRPs, the physical TRPs may be an array of antennas (e.g., as in a multiple-input multiple-output (MIMO) system or where the base station employs beamforming) of the base station. Where the term "base station" refers to multiple non-co-located physical TRPs, the physical TRPs may be a distributed antenna system (DAS) (a network of spatially separated antennas connected to a common source via a transport medium) or a remote radio head (RRH) (a remote base station connected to a serving base station). Alternatively, the non-co-located physical TRPs may be the serving base station receiving the measurement report from the UE and a neighbor base station whose reference RF signals (or simply "reference signals") the UE is measuring. Because a TRP is the point from which a base station transmits and receives wireless signals, as used herein, references to transmission from or reception at a base station are to be understood as referring to a particular TRP of the base station.

An "RF signal" comprises an electromagnetic wave of a given frequency that transports information through the space between a transmitter and a receiver. As used herein, a transmitter may transmit a single "RF signal" or multiple "RF signals" to a receiver. However, the receiver may receive multiple "RF signals" corresponding to each transmitted RF signal due to the propagation characteristics of RF signals through multipath channels. The same transmitted RF signal on different paths between the transmitter and receiver may be referred to as a "multipath" RF signal. As used herein, an RF signal may also be referred to as a "wireless signal," a "radar signal," a "radio wave," a "waveform," or the like, or simply a "signal" where it is clear from the context that the term "signal" refers to a wireless signal or an RF signal.

As a first example, a semiconductor includes an N+ doped InGaAs sub-collector region located at a top of the semiconductor and an N− doped InP collector located below the N+. The N+ sub-collector has a collector contact located on a backside of the semiconductor. The semiconductor includes a P+ doped InGaAs or GaAs Sb base located below the N− collector. The P+ base has a base contact located on the frontside of the semiconductor. The semiconductor includes an N− doped InP emitter located below the P+ base and an N+ doped emitter cap (graded InP and InGaAs) located below the emitter. The N+ emitter cap has an emitter contact located on the frontside of the semiconductor. The semiconductor implements a heterojunction bipolar transistor (HBT) on a Silicon (Si) substrate. The semiconductor includes (1) a first mesa located on the frontside of the semiconductor and associated with the emitter and (2) a second mesa located on the backside of the semiconductor and associated with the collector. The N+ sub-collector comprises Indium Gallium Arsenide (InGaAs), the N− collector comprises Indium Phosphide (InP), and the P+ base comprises Gallium Arsenide Antimonide (GaAsSb) or Indium Gallium Arsenide (InGaAs). The semiconductor hetero-integrates an antenna module to the backside of the semiconductor, with a Silicon interposer hybrid bonded and interconnected to the frontside of the semiconductor, and a reconstituted complementary metal oxide semiconductor (CMOS) wafer hybrid bonded to the Silicon interposer. One or more passive components are embedded into the Silicon interposer. The reconstituted CMOS wafer includes at least one CMOS beamformer, and at least one silicon-on-insulator (SOI) switch. The semiconductor is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a base station, a server, and a device in an automotive vehicle.

As a second example, a semiconductor that includes a heterojunction bipolar transistor (HBT) may be fabricated. The fabrication includes: growing an epitaxial stack comprising the aforementioned layers of the InP HBT on a Silicon substrate, depositing emitter metal, performing a photo-resist strip, performing a lithography of an emitter mesa, performing an etch of the emitter mesa, performing a photo-resist strip, depositing Silicon Nitride, performing the lithography of a metal of a base, performing an etch of the Silicon Nitride, performing an etch of Indium Phosphide, depositing base metal, performing a lift-off, depositing additional Silicon Nitride, bonding a frontside of the semiconductor to a sacrificial wafer, grinding and etching the Silicon substrate down to a sub-collector, patterning a base, patterning a collector, depositing a dielectric, and patterning vias and metals. The collector contact is on the backside, whereas the emitter and base contacts are on the front side of the semiconductor. The fabrication process further includes debonding the sacrificial wafer from the frontside of the semiconductor and hetero-integrating the chiplets on either side of a Si interposer or laminate. The fabrication process also includes embedding one or more passive components into the Silicon interposer or laminate. The heterojunction bipolar transistor (HBT) includes: (1) an N+ sub-collector comprising Indium Gallium Arsenide (InGaAs), (2) an N− collector comprising Indium Phosphide (InP), and (3) a P+ base comprising Gallium Arsenide Antimonide (GaAsSb) or Indium Gallium Arsenide (InGaAs). The fabrication process includes (1) creating a first mesa located on the frontside of the semiconductor and associated with the emitter and (2) creating a second mesa located on the backside of the semiconductor and associated with the collector. The fabrication process further includes hetero-integrating with the semiconductor at least one of: (1) a complementary metal oxide semiconductor (CMOS) low noise amplifier (LNA), (2) a complementary metal oxide semiconductor (CMOS) beamformer, (3) a silicon-on-insulator (SOI) switch, or (4) a Silicon interposer that includes one or more embedded passive components. The semiconductor is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

As a third example, a semiconductor includes a heterojunction bipolar transistor (HBT) on a Silicon (Si) substrate, the HBT includes: (1) a sub-collector located on the Silicon substrate, (2) a collector located below the sub-collector, the collector having a collector contact located on a backside of the semiconductor, (3) a base located below the collector, the base having a base connector located on a frontside of the semiconductor, (4) an emitter located below the base, the emitter having an emitter contact located on the frontside of the semiconductor, and (5) an emitter cap located below the emitter. The semiconductor includes a first mesa associated with the emitter that is located on the frontside of the semiconductor, and a second mesa associated with the collector that is located on the backside of the semiconductor. The sub-collector comprises Indium Gallium Arsenide, the collector comprises Indium Phosphide, the base comprises either: (i) Gallium Arsenide Antimonide or (ii) Indium Gallium Arsenide, and the emitter comprises Indium Phosphide. The semiconductor includes hetero-integration of an antenna module to the backside of the semiconductor, hybrid bonding a Silicon interposer to the frontside of the semiconductor, and hybrid bonding a reconstituted complementary metal oxide semiconductor (CMOS) wafer to the Silicon interposer. Passive components are embedded into the Silicon interposer. The reconstituted CMOS wafer includes multiple radio frequency front end (RFFE) components, such as, for example, a CMOS low noise amplifier (LNA), a CMOS beamformer, and a silicon-on-insulator (SOI) switch. The semiconductor is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

As a fourth example, a semiconductor comprising a heterojunction bipolar transistor (HBT) is fabricated. The fabrication includes (1) forming a sub-collector on a Silicon substrate, (2) forming a collector located below the sub-collector, the collector having a collector contact located on a backside of the semiconductor, (2) forming a base located below the collector, the base having a base connector located on a frontside of the semiconductor, (3) forming an emitter located below the base, the emitter having an emitter contact located on the frontside of the semiconductor, (4) forming an emitter cap located below the emitter, (5) forming a first mesa associated with the emitter that is located on the frontside of the semiconductor, and (6) forming a second mesa associated with the collector that is located on the backside of the semiconductor. In fabricating the semiconductor, the sub-collector comprises Indium Gallium Arsenide, the collector comprises Indium Phosphide, the base comprises either: (i) Gallium Arsenide Antimonide or (ii) Indium Gallium Arsenide, and the emitter comprises Indium Phosphide. The fabrication includes hetero-integration of: (1) an antenna module to the backside of the semiconductor, (2) hybrid bonding a Silicon interposer to the frontside of the semiconductor, and (3) hybrid bonding a reconstituted CMOS wafer to the Silicon interposer. The fabrication includes embedding passive components into the Silicon interposer. For example, the reconstituted CMOS wafer may include multiple radio frequency front end (RFFE) components, such as, for example, a CMOS low noise amplifier (LNA), a CMOS beamformer, and a silicon-on-insulator (SOI) switch. The semiconductor may be incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

FIG. 1 illustrates an exemplary cross-section of a semiconductor structure 100 with a first side or backside collector contact 113, according to various aspects of the disclosure. For convenience, the description herein will generally use backside. The semiconductor structure 100 includes a heterojunction bipolar transistor (HBT) 101 that is created using a Silicon (Si) substrate that is later removed, a first inter-layer dielectric (ILD) 102 and a second ILD 103 enclosing the HBT 101. In some aspects, the Si substrate may be 300 mm. The semiconductor structure 100 also includes an insulator 110 (e.g., passivation material), such as Silicon Nitride (SiN), disposed over the HBT 101 and between the first ILD 102 and the second ILD 103. In some aspects, the semiconductor structure 100 includes a hybrid bond interface 104, between an active portion (including HBT 101) and an Si interposer 130. In some aspects, e.g., as described below in FIGS. 3A, 3B, 3C, and 3D, a sacrificial wafer may be used during processing instead of the hybrid bond interface 104 to the Si interposer 130. As used herein, the term hybrid bonding refers to an alternative to thermocompression bonding. In hybrid bonding, a permanent (or semi-permanent) bond combines a dielectric bond with embedded metal to form interconnections. Hybrid bonding is also referred to as direct bonding, or fusion bonding, because the wafer bonding process does not use additional intermediate layers. The bonding process is based on chemical bonds between two surfaces of any material where the wafer surface is sufficiently clean, flat, and smooth. In some aspects, hybrid bonding includes the use of adhesives. Hybrid bonding may include the use of various interconnect metals, such as, for example, copper (Cu), indium (In), silver (Ag), or the like.

The semiconductor structure 100 includes the Si interposer 130 having various metals 108 (e.g., metal layers) in a third ILD 106. Vias 139 provide an electrical connection between metals 108 and interconnects 111 which form part of the hybrid bond interface 104. Each via is an opening in an insulating layer of ILD 106 to enable a conductive connection between different layers. Connectors 124 may be formed as bumps, balls, pins or any suitable configuration for connecting the semiconductor structure 100 through Si interposer 130 to other devices. In some cases, the connectors 124 may be a hybrid bond to connect Radio Frequency Front End (RFFE) components to the semiconductor structure 100.

FIG. 1 illustrates a configuration of an InP HBT wafer on Si with a backside collector contact that reduces the base collector junction area (e.g., 126) by about 30%, resulting in about 2 dB in power gain. In accordance with some aspects, a sub-collector 112 may be N+ indium gallium arsenide (InGaAs) (also referred to as gallium indium arsenide, GaInAs). Backside collector contact 113 is formed on the sub-collector 112 (e.g., InGaAs) on a backside of the semiconductor structure 100. The collector 114 may be N—InP. A base 116 may be P+ Gallium Arsenide Antimonide (GaAsSb) or indium gallium arsenide (InGaAs). One or more base contacts 117 may be formed on the frontside of the semiconductor structure 100 and coupled to the P+ GaAsSb base 116.

The collector 114 (e.g., N—InP), and sub-collector 112 (e.g., InGaAs) are configured as a collector mesa, which protrudes from the base 116 (e.g., P+ GaAsSb). The base-collector junction 126 is located between the base 116 and the collector 114. The capacitance of the base-collector junction (Cbc) is reduced by about 30% due to the collector mesa configuration. An emitter 118 may include InP. The base 116, the collector 114, and the emitter 118, and emitter cap 120 may be collectively referred to as an epitaxial stack. The emitter cap 120 may be doped N+ and may be graded from InP to InGaAs. An emitter contact 122 is formed on the emitter cap 120 on a second side or front side of the semiconductor structure 100. For convenience, the description herein will generally use front side, but it will be appreciated that it should generally be construed to reference relative position, e.g., the backside (first side) is opposite the front side (second side). Connectors 124 may be formed as bumps, balls, pins or any suitable configuration for connecting the semiconductor structure 100 to other devices. In some aspects, the base contact 117 may be a circular deposition, in other aspects the base contact 117 may be two rectangular stripes on either side of the emitter 118 (as illustrated in FIG. 1). In other aspects, the base contact 117 may be a single rectangular stripe that is parallel to the emitter cap 120. Accordingly, it will be appreciated that the various aspects disclosed are not limited to the illustrated examples, which are provided solely to aid in explanation of the various aspects.

FIGS. 2A, 2B, 2C, and 2D illustrate a portion of a process to create a structure with a backside collector contact, according to aspects of the disclosure. The process described in FIGS. 2A, 2B, 2C, and 2D is common when using a sacrificial wafer (e.g., FIGS. 3A, 3B, 3C, and 3D) or an Si interposer (e.g., FIGS. 4A, 4B, 4C, and 4D). Thus, the process when using a sacrificial wafer is described by FIGS. 2A, 2B, 2C, and 2D followed by FIGS. 3A, 3B, 3C, and 3D and the process when using an Si interposer is described by FIGS. 2A, 2B, 2C, and 2D followed by FIGS. 4A, 4B, 4C, and 4D.

Figure 2A:
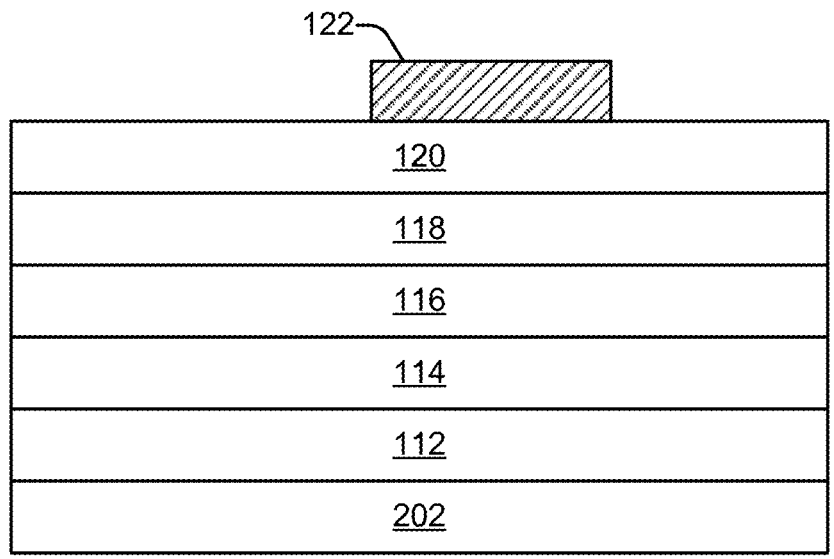
FIGS. 2A, 2B, 2C, and 2D illustrate a portion of a process to create a structure with a backside collector contact, according to aspects of the disclosure.

In FIG. 2A, an InP epitaxial stack is grown on an Si substrate 202. The Si substrate 202 may be, for example, 300 millimeters (mm) in diameter and of 100 crystalline orientation. It will be appreciated that other sizes and orientations of Si substrates may be used as appropriate. On top of the Si substrate 202 is the sub-collector 112. On top of the sub-collector 112 is the collector 114 (e.g., N—InP). On top of the collector 114 is the base 116 (e.g., P+ GaAsSb). On top of the 116 is the emitter 118 (e.g., InP). On top of the emitter 118 is the emitter cap 120. The process includes forming an emitter contact 122. For example, the process can include depositing a metal, depositing a photoresist and patterning, removing excess metal and performing a strip (e.g., removal) of photoresist.

Figure 2B:
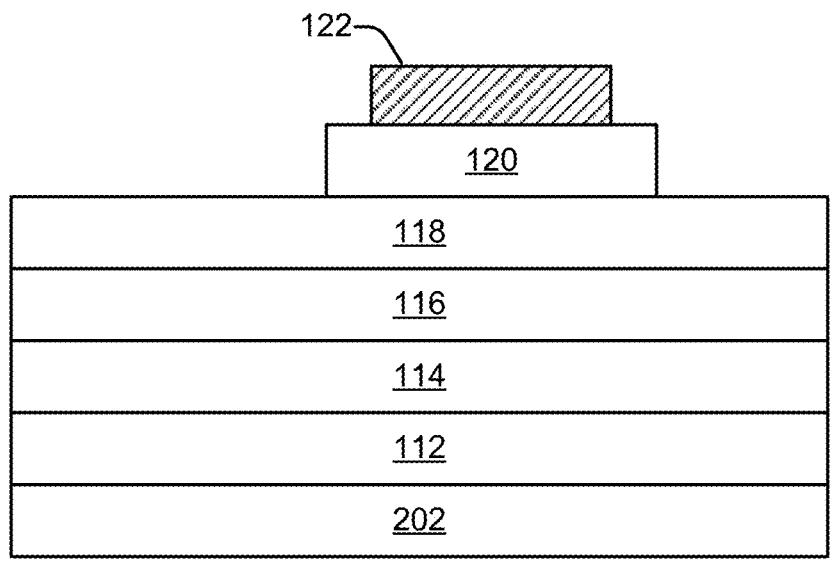

FIG. 2B illustrates a portion of the process for forming the emitter cap 120. The process includes performing lithography and etching followed by a photoresist stripping process to create a mesa which forms the emitter cap 120 on the emitter 118. The process may include depositing Silicon Nitride ($Si_3N_4$) (not shown).

Figure 2C:
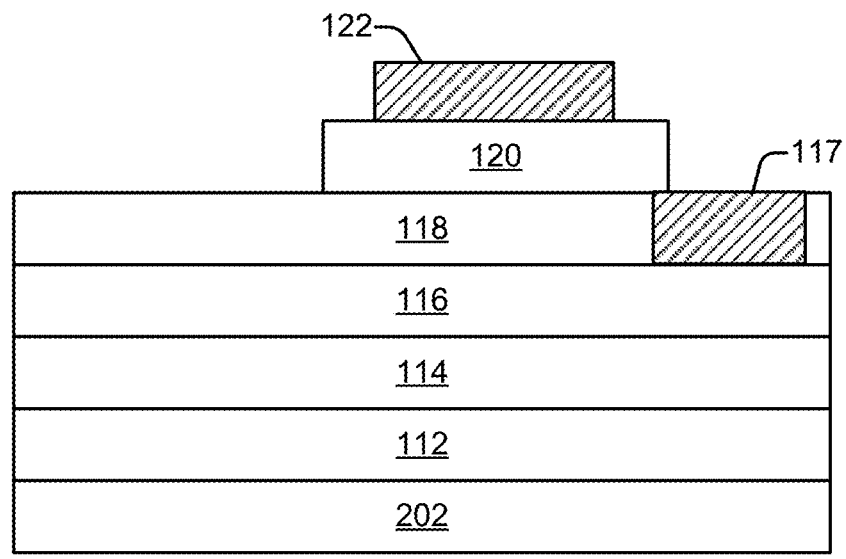

FIG. 2C illustrates a cross-section after base metal lithography and etching to form the base contact 117 on the base 116.

Figure 2D:
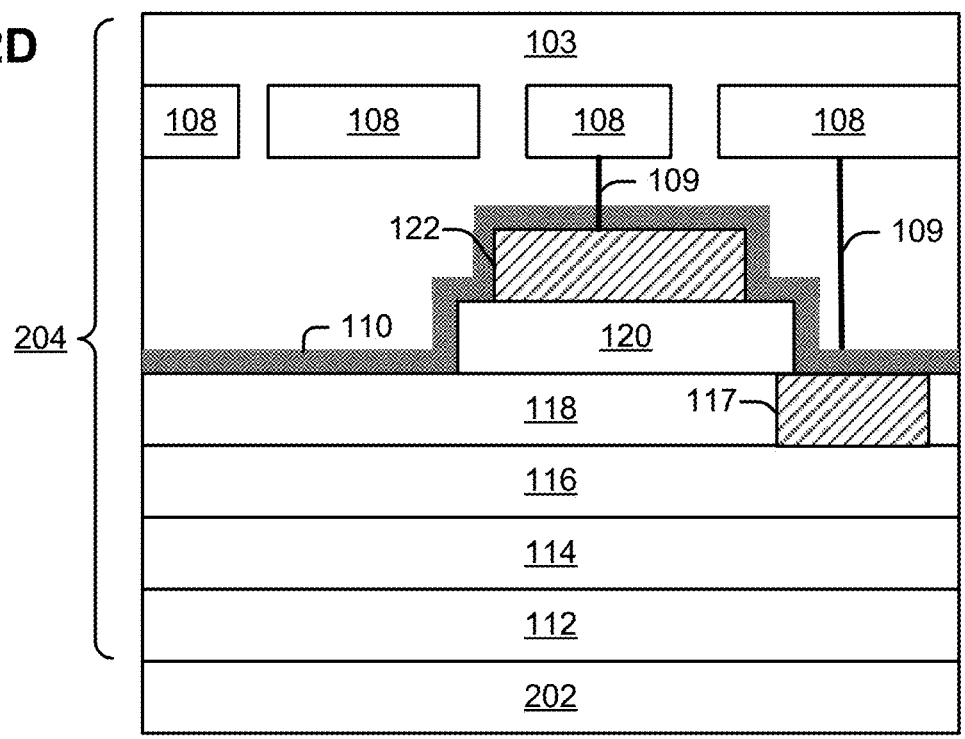

FIG. 2D illustrates a cross-section of structure 204 after further processing. The process forms the second ILD 103, the insulator 110, the metals 108 and the vias 109, as illustrated. For example, the insulator 110 (e.g., Silicon Nitride) may be deposited over the base contact 117, emitter cap 120, emitter contact 122, and emitter 118. Second ILD 103 can be deposited over the insulator 110. A metal layer can be deposited on second ILD 103 and then patterned and etched to form metals 108. Vias 109 can be formed in openings in the ILD 103 and insulator 110 to couple some of the metals 108 to the base contact 117 and emitter contact 122. Additional deposition of second ILD 103 can be used to cover the metals 108. Further, for ease of understanding, a first layer of metal 108 is illustrated in FIG. 2D. However, it should be understood that the process may add additional (e.g., 2, 3, 4, etc.) layers of metal. The process continues with structure 204 being further processed according to a first aspect (e.g., FIGS. 3A, 3B, 3C, and 3D) or a second aspect (FIGS. 4A, 4B, 4C, and 4D).

FIGS. 3A, 3B, 3C, and 3D illustrate using a sacrificial wafer to complete a process to create an InP HBT with a backside collector contact, according to aspects of the disclosure. In FIGS. 3A, 3B, 3C, and 3D, the structure 204 from FIG. 2D is shown rotated 180 degrees.

Figure 3A:
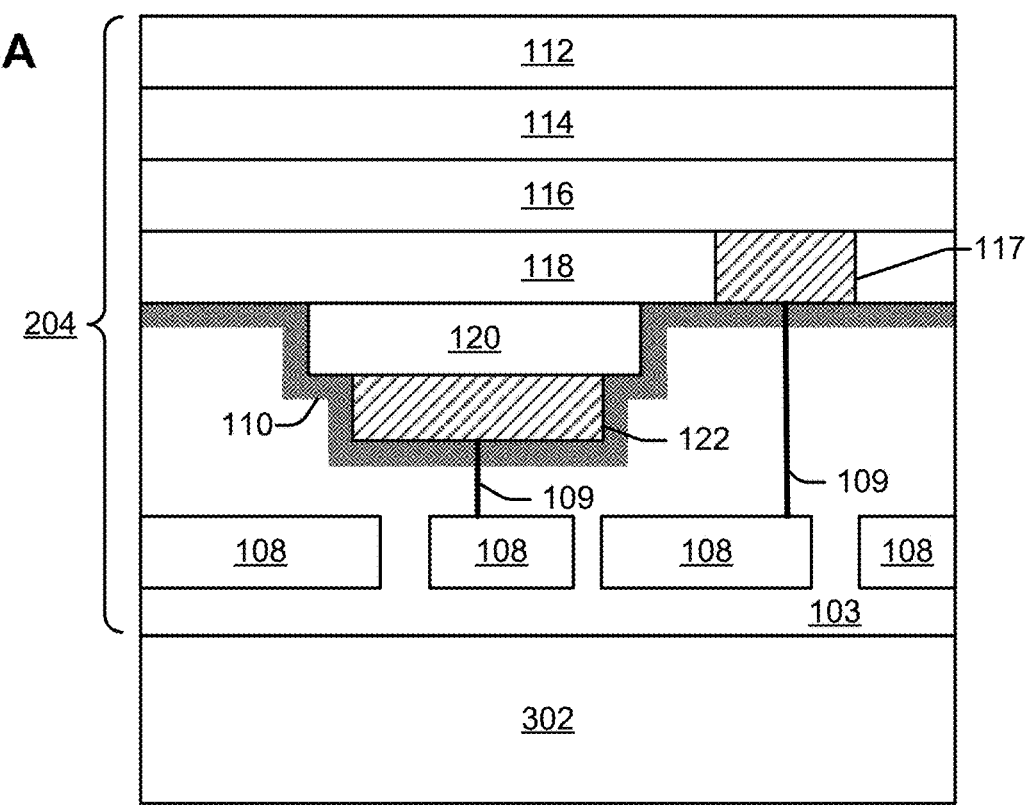
FIGS. 3A, 3B, 3C, and 3D illustrate using a sacrificial wafer to complete a process to create a structure with a backside collector contact, according to aspects of the disclosure.

In FIG. 3A, the process bonds a wafer 302 to structure 204 on the second ILD 103. The wafer 302 is also referred to as a sacrificial wafer because the wafer 302 is later de-bonded. The process includes grinding and/or etching the Si substrate (202, not illustrated) to expose the sub-collector 112 (e.g., N+ InGaAs), resulting in the structure illustrated in FIG. 3A.

Figure 3B:
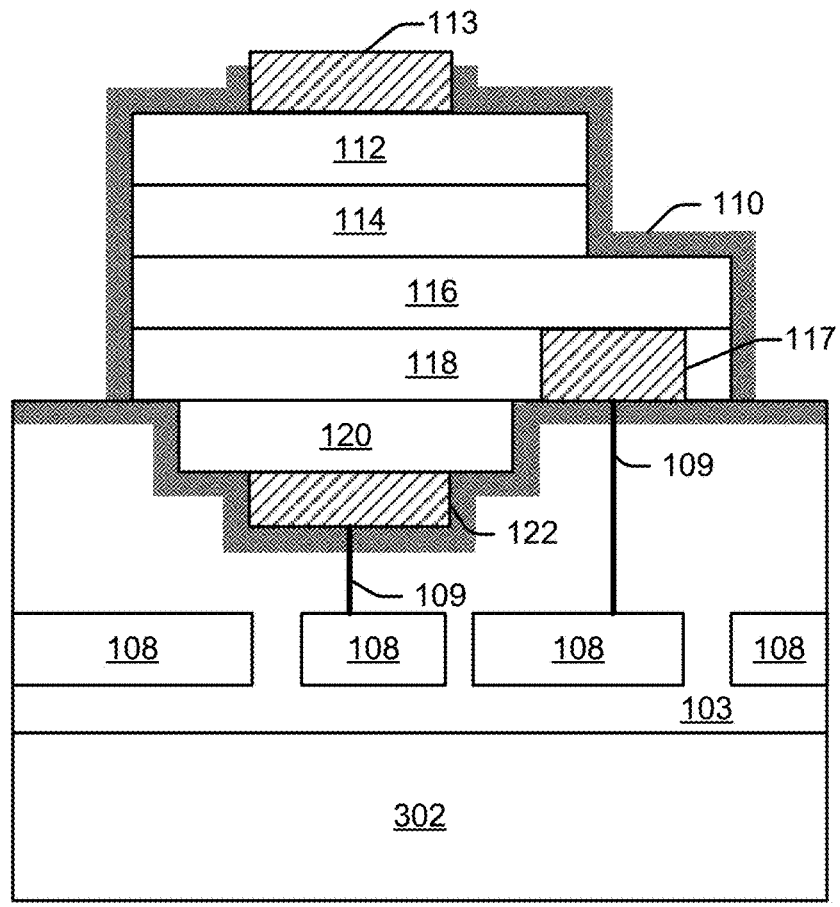

In FIG. 3B, the process continues with forming the base 116 (e.g., P+ GaAs Sb), the collector 114 (e.g., N—InP), and sub-collector 112. An insulating layer is deposited, which may be Silicon Nitride, and expands insulator 110 (e.g., insulation layer) to cover the emitter 118, collector 114 and sub-collector 112, which have been patterned and etched. Further, the collector contact 122 (e.g., metal) is formed and coupled to sub-collector 112.

Figure 3C:
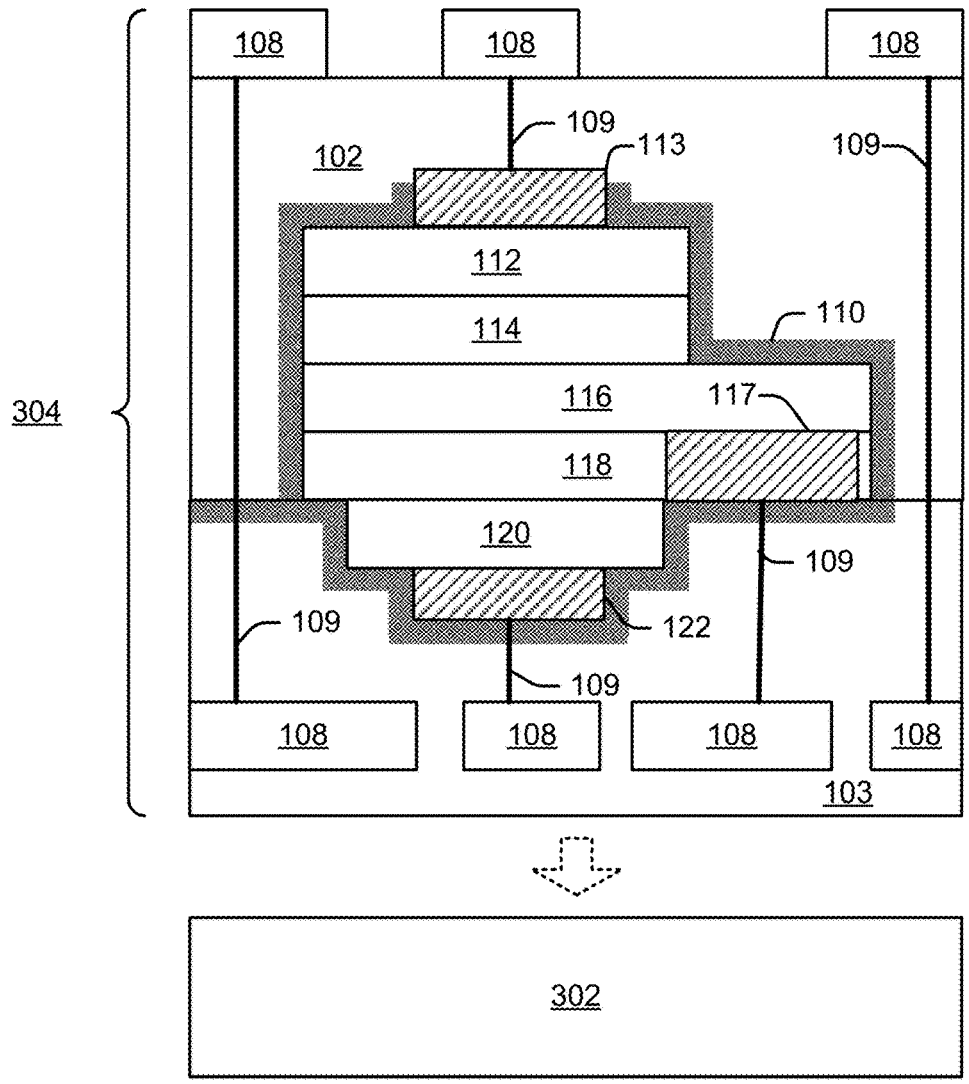

In FIG. 3C, the wafer 302 is de-bonded from InP structure 304 and may be reused or discarded. Before debonding, the process further includes, forming the first ILD 102, and patterns additional metal interconnect layers such as metals 108 on top of ILD 102 and the vias 109, as illustrated in FIG. 3C.

Figure 3D:
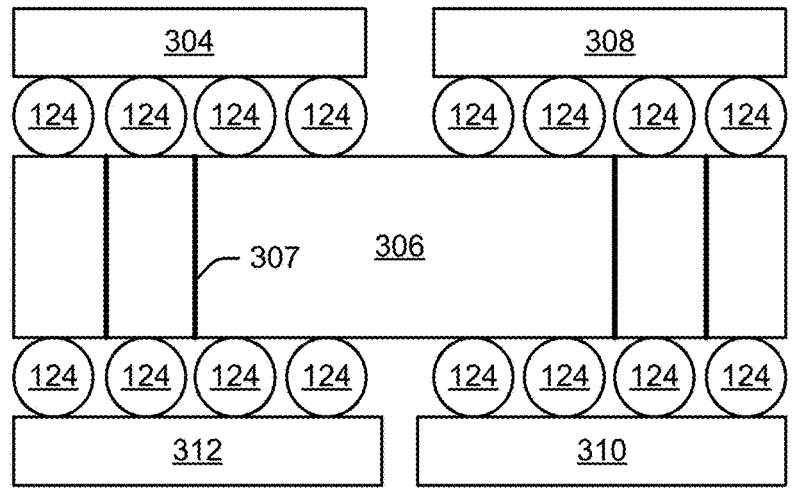

In FIG. 3D, the process hetero-integrates the diced chips with InP structure 304 (e.g., HBT) with other chiplets or dies, on both sides of a substrate or Si interposer 306, which in some aspects may include embedded passive components. The embedded passive components (e.g., inductors, capacitors) may function as the input and output matching networks of an HBT based power amplifier (PA) or a CMOS based low noise amplifier (LNA). In the illustrated configuration, an Si interposer 306 includes a plurality of through vias 307 (e.g., Through Silicon Vias (TSV)) to provide an electrical connection between contacts on each side of the Si interposer 306. It will be appreciated that in addition to the vias 307, the Si interposer 306 may include multiple metal layers and also embedded passive components (not illustrated). The embedded passive components serve as matching network for PAs and/or LNAs. Embedded passive components that are directly under or above the PA or LNA chiplet decreases insertion loss due to the proximity to the respective PA, LNA. In contrast, discrete capacitors and inductors placed beside the PA, LNA result in longer interconnects and larger insertion losses. Therefore, such passive components improve the overall RF front end. The diced InP structure 304 may function as a power amplifier and/or a low noise amplifier. The other chiplets may include, for example, a complementary metal oxide semiconductor (CMOS) based low noise amplifier (LNA) 308, silicon-on-insulator (SOI) switch 310, and CMOS beamformer 312. The chiplets shown in FIG. 3D are purely for illustration purposes and it should be understood that other types of chiplets may be used in addition to or instead of the chiplets shown.

FIGS. 4A, 4B, 4C, and 4D illustrate using a Silicon (Si) interposer to complete a process to create an HBT semiconductor structure with a backside collector contact, according to aspects of the disclosure. In FIGS. 4A, 4B, 4C, and 4D, the structure 204 from FIG. 2D is shown rotated 180 degrees.

Figure 4A:
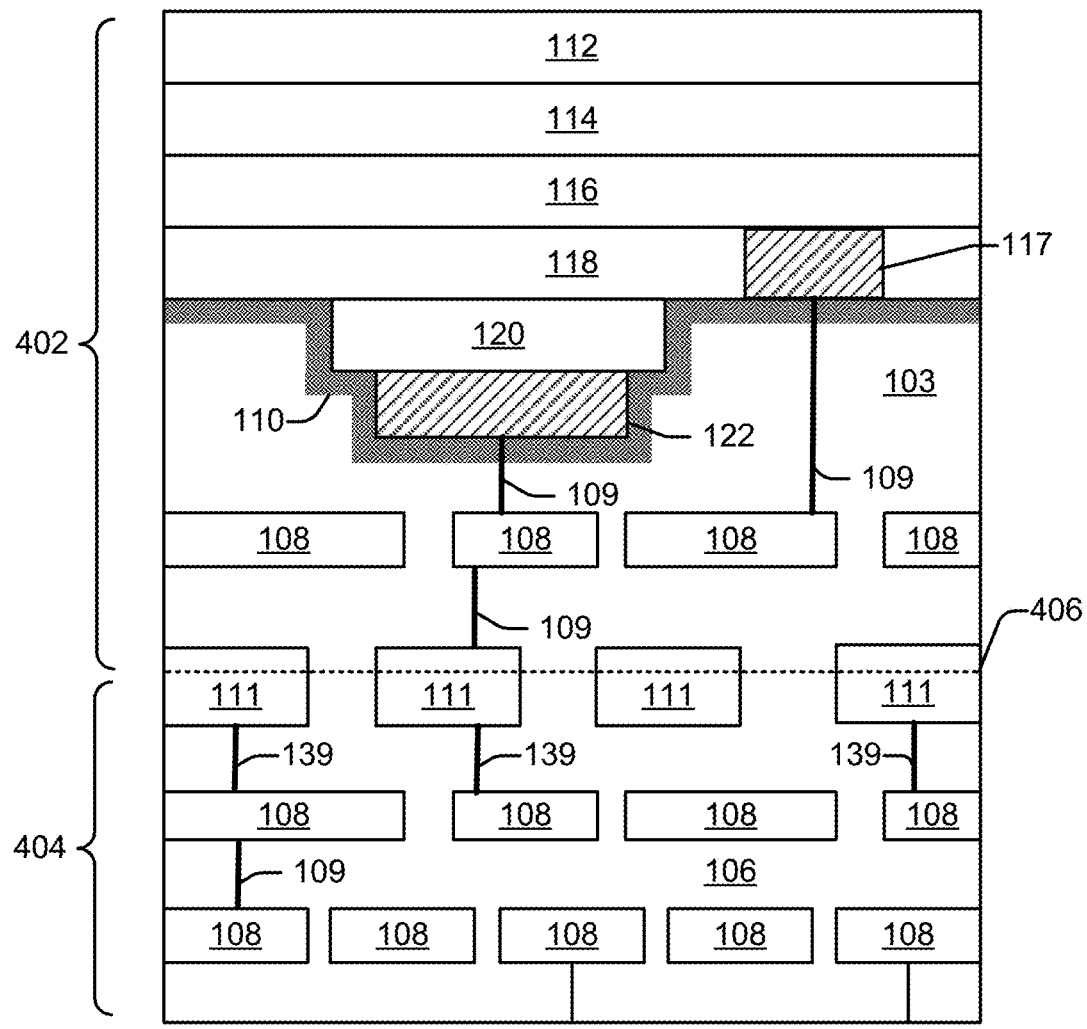
FIGS. 4A, 4B, 4C, and 4D illustrate using a Silicon (Si) interposer to complete a process to create a structure with a backside collector contact, according to aspects of the disclosure.

In FIG. 4A, the process creates a hybrid bond interface 406 and interconnects 111 an HBT structure 402 to an Si interposer 404. The process grinds and etches the Si substrate to the sub-collector 112 (e.g., N+ InGaAs), resulting in the structure illustrated in FIG. 4B. In addition, in FIG. 4B, the process patterns the P+ GaAsSb base 116, patterns the N—InP collector 114, performs a nitride deposition, and patterns collector contact 113.

Figure 4B:
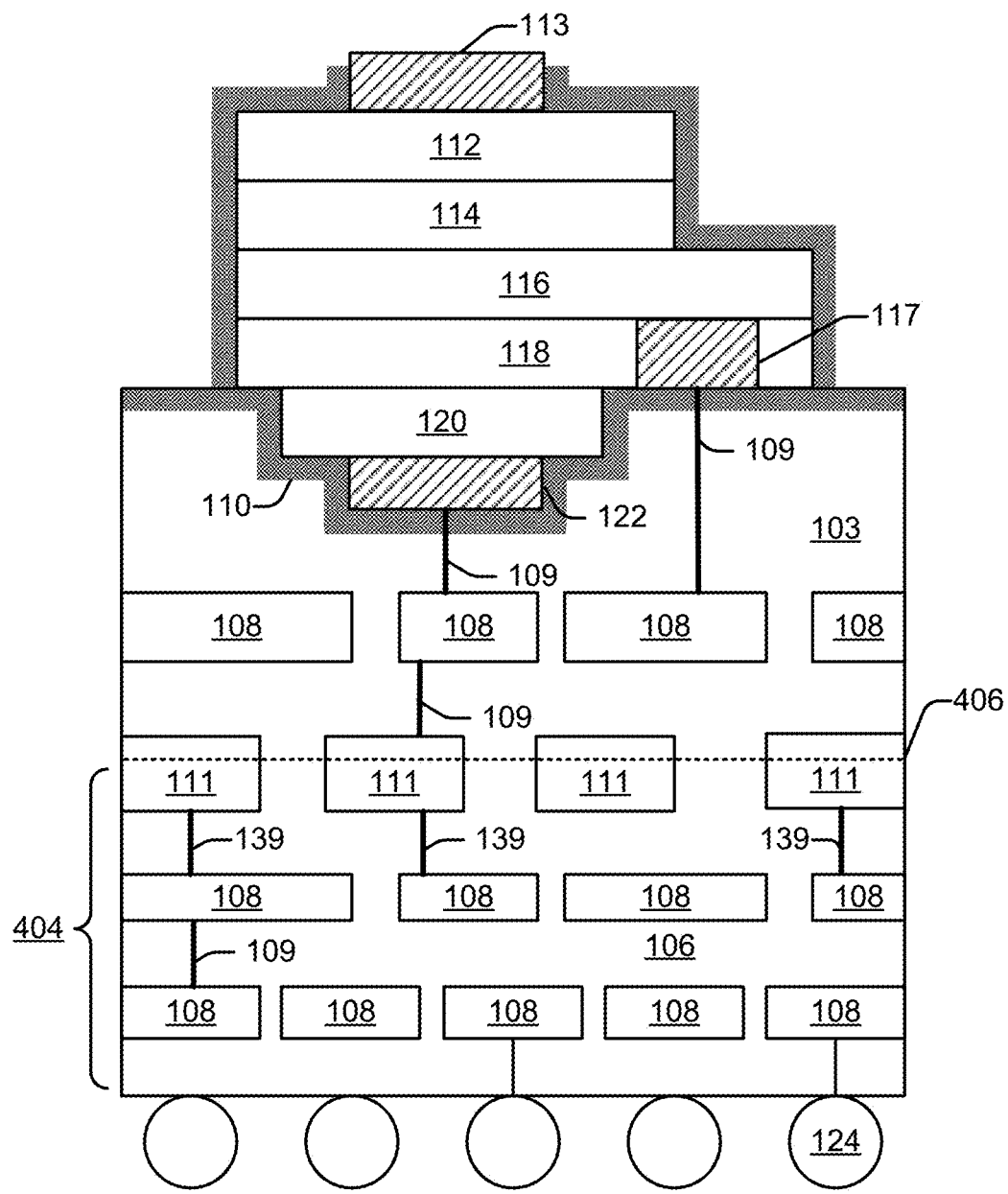
Figure 4C:
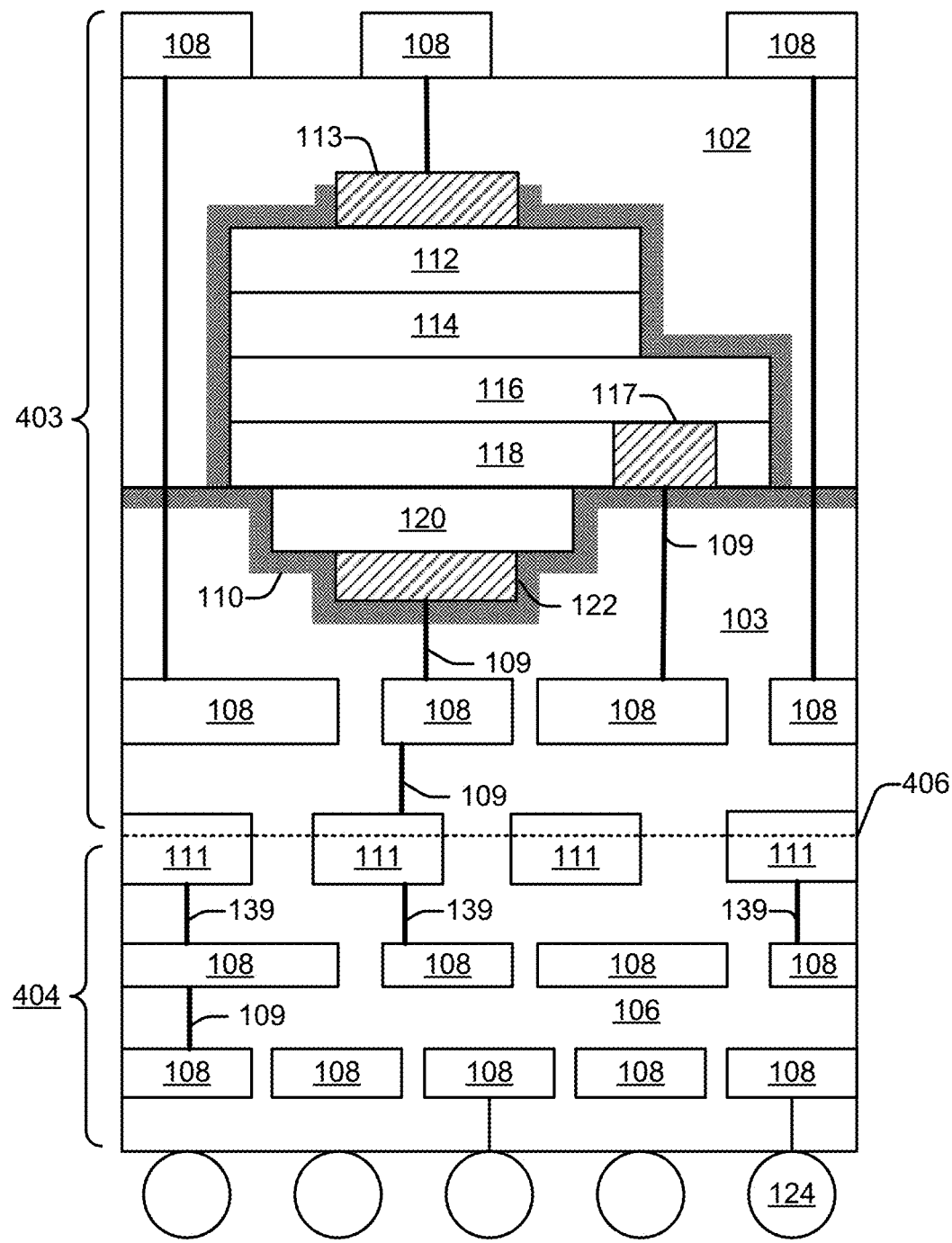

In FIG. 4C, the process continues with adding the first ILD 102, and patterns additional ones of the metals 108 and the vias 109, resulting in an HBT wafer 403.

Figure 4D:
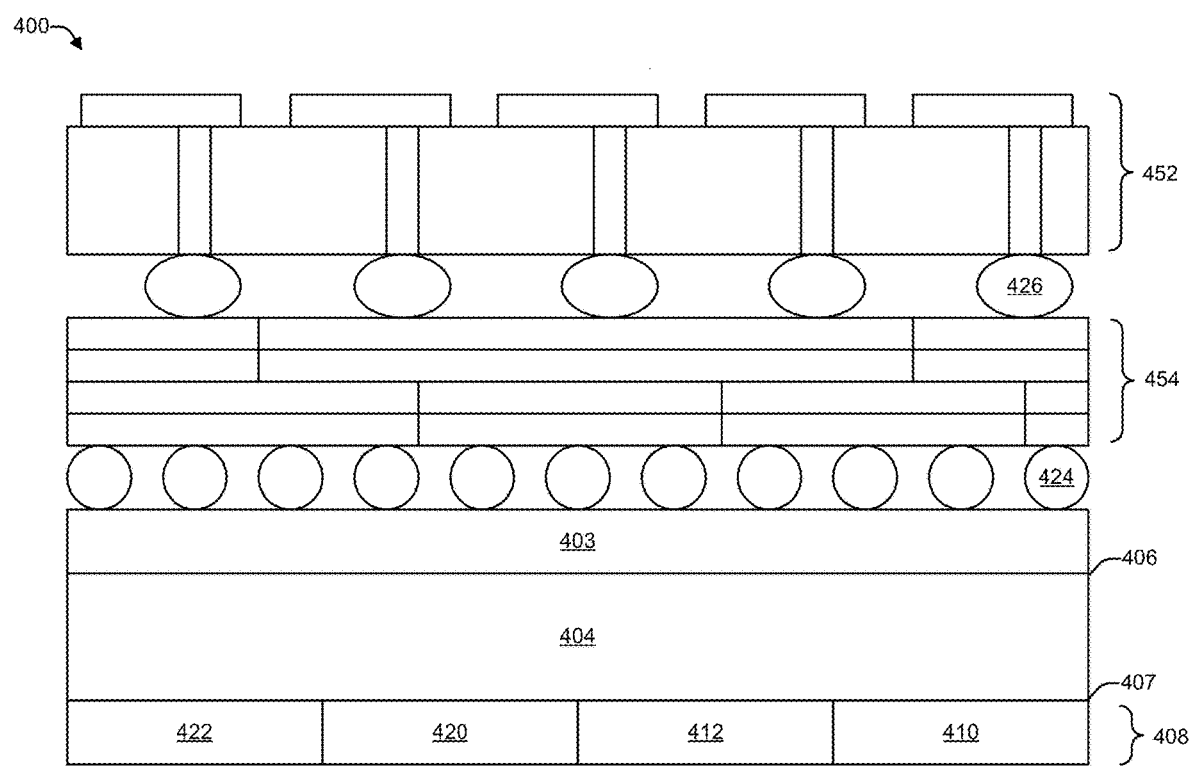

In FIG. 4D, the process uses the hybrid bonding interface 406 (e.g., or another type of connection means) to interconnect the heterojunction bipolar transistor (HBT) wafer 403 (e.g., as shown in FIG. 4C) to Si interposer 404 that includes embedded passive components, to create a semiconductor 400. The process interconnects 407 (e.g., using hybrid bonding, solder balls, or another type of connection means) the Si interposer 404 to a reconstituted CMOS wafer 408. The reconstituted CMOS wafer 408 may include various radio frequency front end (RFFE) components, such as, for example, an SOI switch 410, an CMOS beamformer 412, an SOI switch 420, and a CMOS beamformer 422. A package substrate 454 is attached (e.g., using connections 424, such as solder balls, pins, or the like) to a top surface of the HBT wafer 403. An antenna module 452 is attached (e.g., using connections 426, such as solder balls, pins, or the like) to a top surface of the package substrate 454 and is connected to the HBT wafer 403 through the package substrate 454. The antenna module 452 may include multiple antenna tiles. For a mm-wave 3-dimensional integrated circuit (3DIC) stack, vertical routing may be used directly, without detour. Thus, integration on both sides of an Si interposer, with through-silicon via (TSV), fine-pitch interconnects provide for chip-on-wafer-on-substrate (CoWoS) integration.

In the flow diagrams of FIGS. 5, 6, 7, and 8, each block represents one or more operations that can be implemented in hardware, software, or a combination thereof. In the context of software, the blocks represent computer-executable instructions that, when executed by one or more processors, cause the processors to perform the recited operations. Generally, computer-executable instructions include routines, programs, objects, modules, components, data structures, and the like that perform particular functions or implement particular abstract data types. The order in which the blocks are described is not intended to be construed as a limitation, and any number of the described operations can be combined in any order and/or in parallel to implement the processes. For discussion purposes, the processes 500, 600, 700, and 800 are described with reference to FIGS. 1, 2A-2D, 3A-3D, 4A-4D, and 5 as described above, although other models, frameworks, systems and environments may be used to implement these processes.

Figure 5:
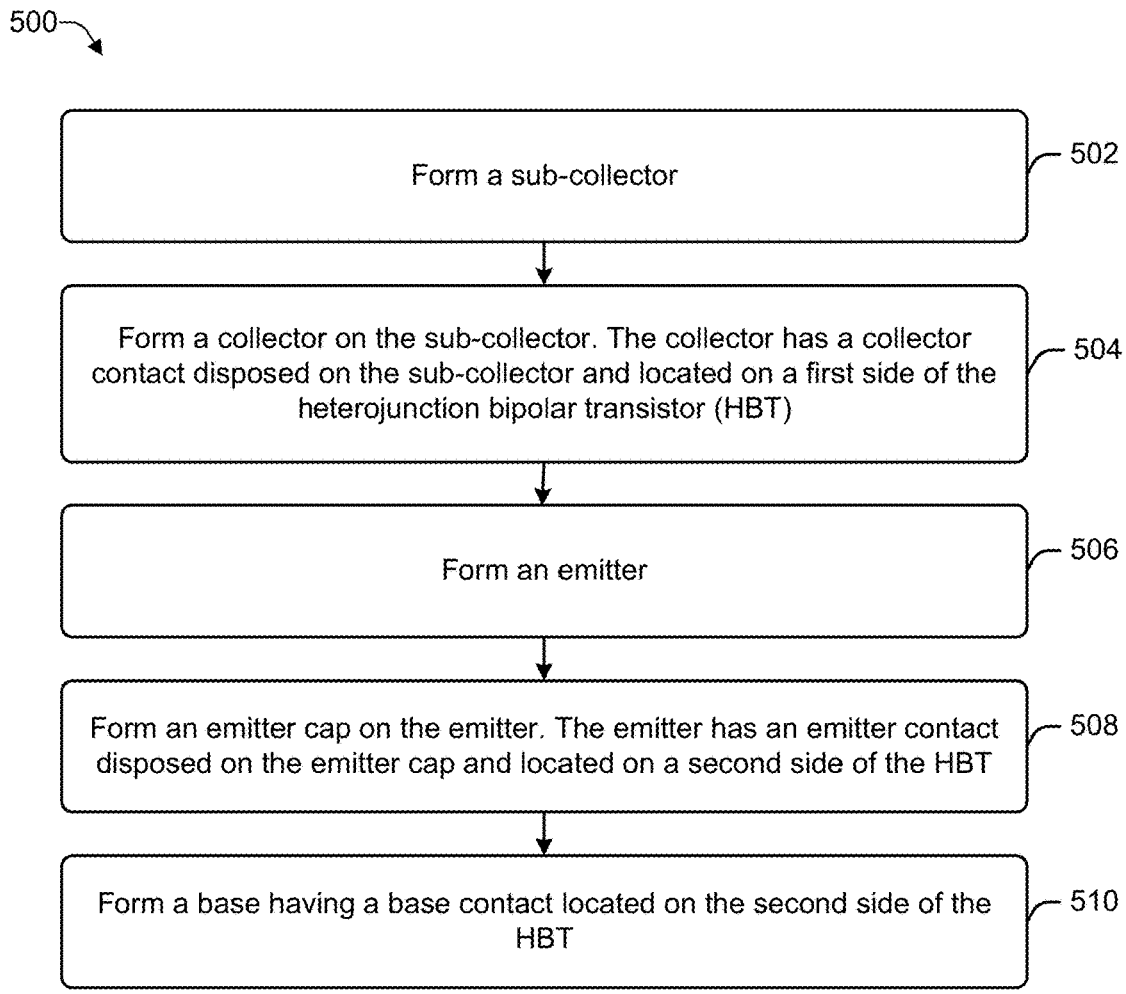
FIG. 5 illustrates a process that includes forming a collector, an emitter, and a base of a semiconductor, according to aspects of the disclosure.

FIG. 5 illustrates a process that includes forming a collector, an emitter, and a base of a semiconductor. The process 500 may be performed as part of a semiconductor manufacturing process.

At 502, the process 500 forms a sub-collector. For example, in FIG. 3A and FIG. 4A, the process grinds and etches the Si substrate to form the sub-collector 112 (e.g., N+ InGaAs), resulting in the structure illustrated in FIG. 3B and FIG. 4B, respectively.

At 504, the process 500 forms a collector on the sub-collector. The collector has a collector contact disposed on the sub-collector and located on a backside of a heterojunction bipolar transistor (HBT) semiconductor. For example, in FIG. 2A, the N—InP collector 114 is formed on the sub-collector 112 (e.g., N+ InGaAs). The process includes depositing a metal to form the emitter contact 122. The collector 114 and sub-collector 112 are configured as a collector mesa, which protrudes from the P+ GaAsSb base 116 on a backside of the HBT.

At 506, the process 500 forms an emitter. For example, in FIG. 2A, the emitter 118 is formed on top of the P+ GaAsSb base 116.

At 508, the process 500 forms an emitter cap on the emitter. The emitter has an emitter contact disposed on the emitter cap and located on a second side of the HBT. For example, in FIG. 2A, the emitter cap 120 is formed on top of the emitter 118.

At 510, the process 500 forms a base having a base contact located on the second side (e.g., frontside) of the HBT semiconductor. For example, in FIG. 2A, the P+ GaAs Sb base 116 is formed on the N—InP collector 114.

Thus, a process grows an epitaxial stack comprising the layers of the InP-based HBT on a Si substrate (e.g., 300 mm diameter, with 100 crystalline orientation). The process grows the epitaxial stack comprising the layers of the InP HBT on an Si substrate, deposits emitter contact 122, and performs a photoresist strip. The process performs mesa lithography and mesa etch to create the mesa of the N+ emitter and performs a photoresist strip and deposits the Silicon Nitride.

A technical advantage includes a hetero-integrated HBT structure in which the HBT has a base-collector junction that is about 30% smaller in area as compared to a conventional structure in which the collector contacts are on a same side as the emitter contacts and the base contacts. The reduction in the size of the base-collector junction is achieved by moving the collector contacts to an opposite side of the emitter contacts and the base contacts. Another technical advantage is that, by reducing the base-collector junction area, a power gain improvement of about 2 db is realized (e.g., compared to the conventional structure). The HBT structure described herein provides for a mesa on both the emitter side and the collector side and enables hetero-integration. For example, an Si interposer may be bonded on the emitter side with chiplets on the other side.

Figure 6:
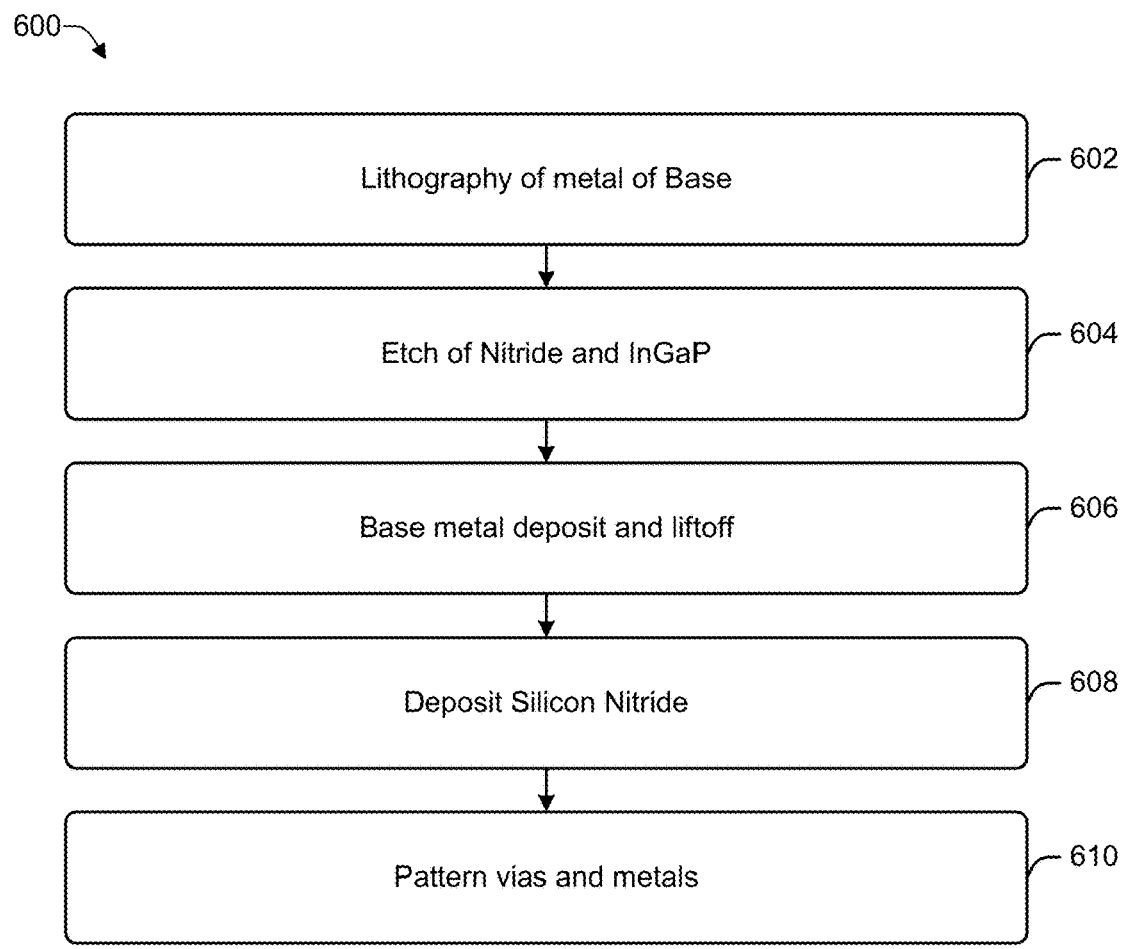
FIG. 6 illustrates an example process that includes patterning vias and metals, according to aspects of the disclosure.

FIG. 6 illustrates an example process that includes patterning vias and metals, according to aspects of the disclosure. The process 600 may be performed as part of a semiconductor manufacturing process.

At 602, the process performs lithography of metals in a base. At 604, the process etches the Silicon Nitride (e.g., that was deposited earlier) and Indium Phosphide (InP). For example, in FIG. 2C, the process performs a lithography of the base contact 117 (e.g., metal) to the P+ GaAsSb base 116.

At 606, the process performs a deposit of base metals and performs liftoff. Lift-off is a technique used to pattern a target material (e.g., a metal) using a sacrificial layer (e.g., photoresist) to define the pattern. The sacrificial layer is applied and patterned, after which the target material is deposited on top. The final step is the removal of the sacrificial material by lifting off the overlying target material. At 608, the process deposits Silicon Nitride. At 610, the process patterns vias and metals. For example, in FIG. 2D, the process adds the third ILD 103, the insulator 110 (e.g., insulation layer), and patterns the metals 108 and the vias 109. For ease of understanding, a 1st level of metal is illustrated in FIG. 2C. However, it should be understood that the process may add additional (e.g., 2, 3, 4, or 5) layers of metal.

Figure 7:
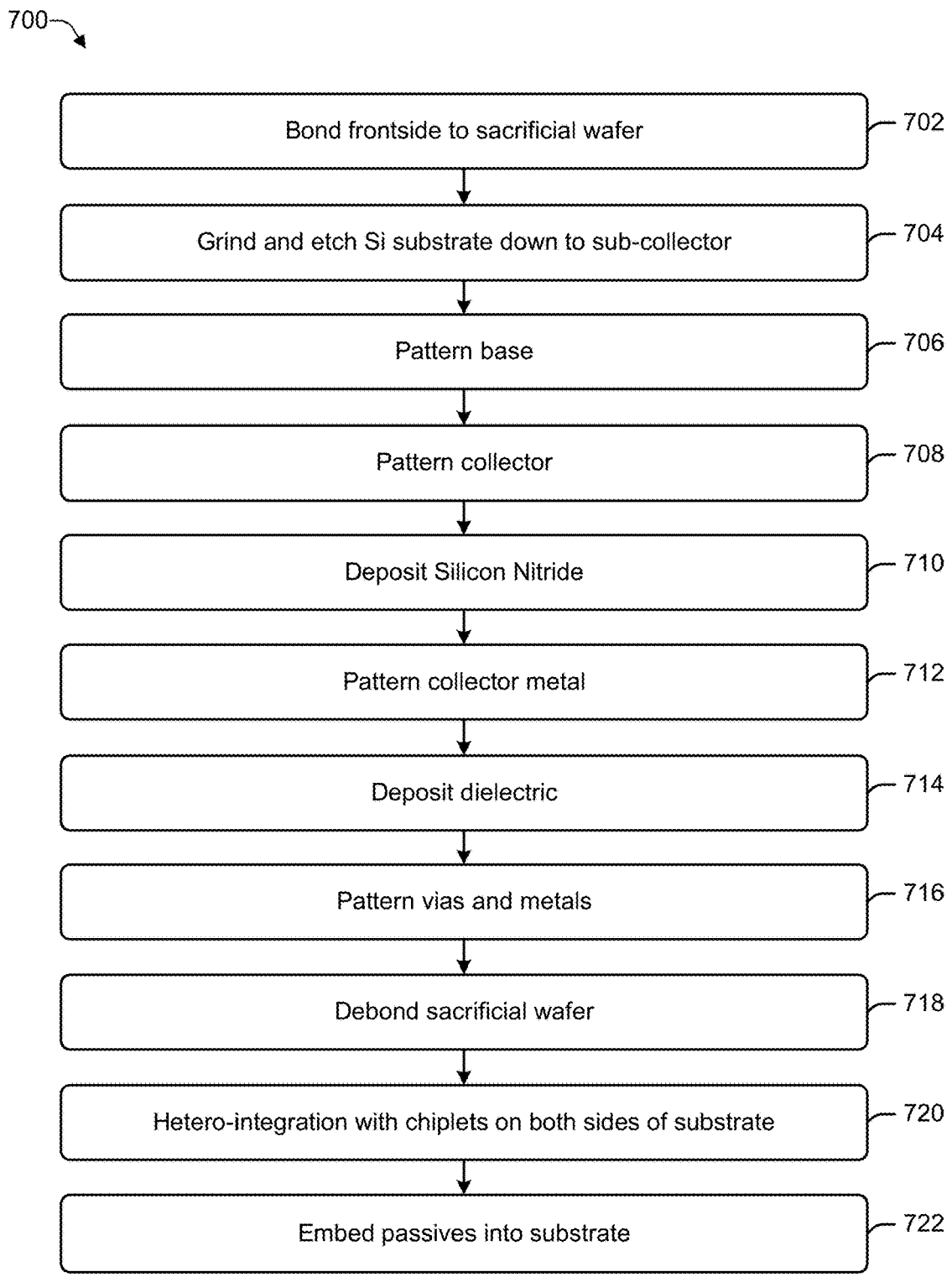
FIG. 7 illustrates an example process that includes bonding a frontside to a sacrificial wafer, according to aspects of the disclosure.

FIG. 7 illustrates an example process 700 that includes bonding a frontside to a sacrificial wafer, according to aspects of the disclosure. The process 700 may be performed as part of a semiconductor manufacturing process.

At 702, the process bonds a front side to a sacrificial wafer. At 704, the process grinds and etches a silicon substrate down to a N+ GaAs sub-collector. At 706, the process patterns a base. At 708, the process patterns a collector. At 710, the process deposits silicon nitride. At 712, the process patterns collector metal. For example, in FIG. 3A, the process bonds the wafer 302 to the second ILD 103. The wafer 302 is referred to as a sacrificial wafer because the wafer is later de-bonded. The process grinds and etches the Si substrate to the sub-collector 112 (e.g., N+ InGaAs), resulting in the structure illustrated in FIG. 3B. In addition, in FIG. 3B, the process patterns the P+ GaAsSb base 116, patterns the N—InP collector 114, deposits Silicon Nitride, and patterns the collector contact 113.

At 714, the process deposits a dielectric. At 716, the process patterns vias and metals. At 718, the process de-bonds the sacrificial wafer. For example, in FIG. 3C, the process adds the first ILD 102, patterns metals 108 and the vias 109, and de-bonds the wafer 302 from the InP structure 304.

At 720, the process hetero-integrates with chiplets on both sides of the Si substrate (e.g., Si interposer). At 722, the process embeds passive components into the Si substrate. For example, in FIG. 3D, the process hetero-integrates the InP structure 304 with chiplets on both sides and embeds passive components into the substrate or interposer. 306 illustrates the Si interposer with embedded passives.

Figure 8:
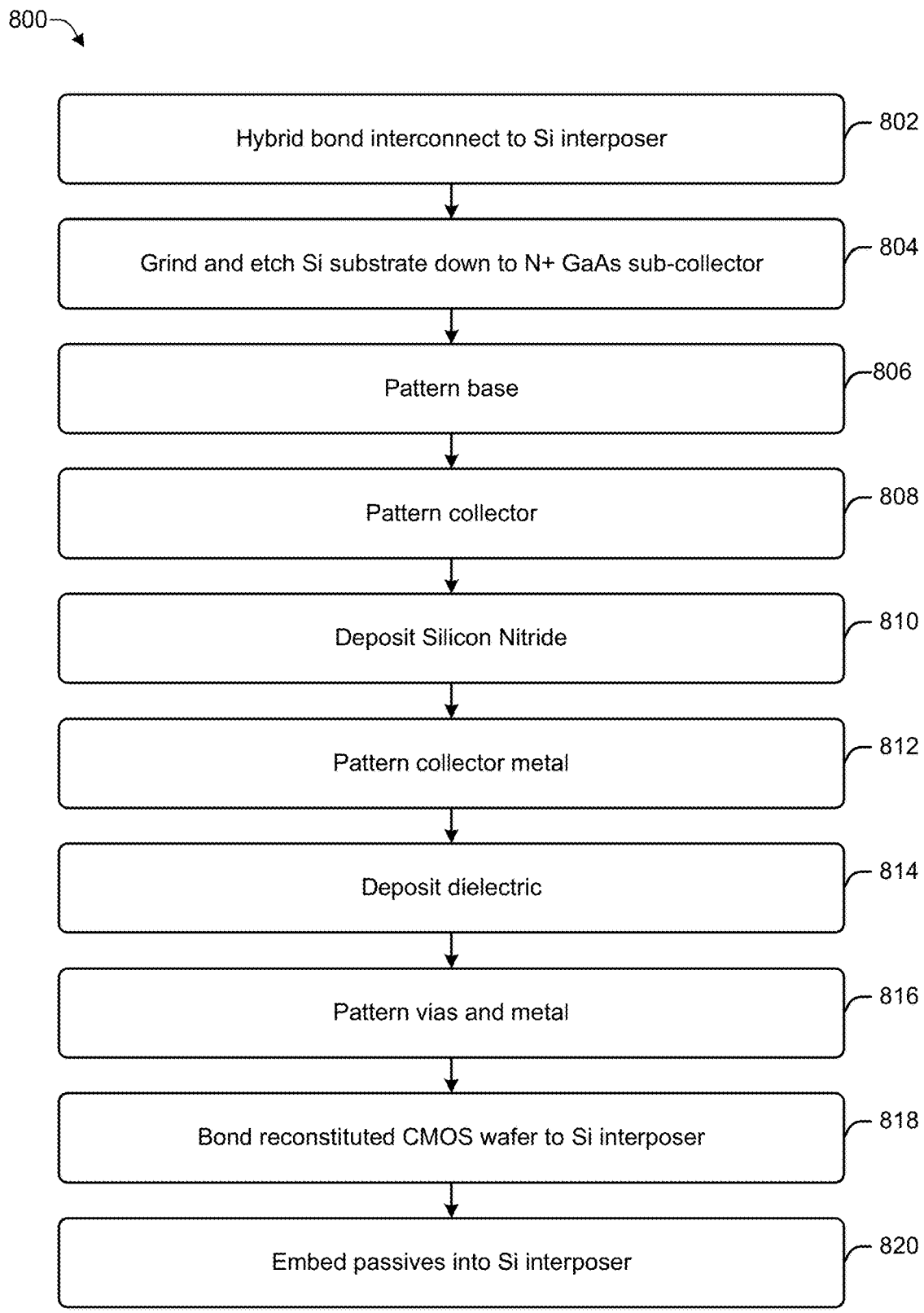
FIG. 8 illustrates an example process that includes hybrid bonding and interconnecting an Si interposer, according to aspects of the disclosure.

FIG. 8 illustrates an example process 800 that includes hybrid bonding and interconnecting an Si Substrate to an Si interposer, according to aspects of the disclosure. The process 800 may be performed as part of a semiconductor manufacturing process.

At 802, the process hybrid bond and interconnects the Si substrate to an Si interposer. At 804, the process grinds and etches the Si substrate down to a N+ GaAs sub-collector. At 806, the process patterns a base. At 808, the process patterns a collector. At 810, the process deposits silicon nitride. At 812, the process patterns collector metal. For example, in FIG. 4A, the process uses hybrid bonding to connect an interface (e.g., hybrid bond interface 406) to the Si interposer 404. FIG. 4B illustrates a result of the process grinding and etching the Si substrate to the sub-collector 112 (e.g., N+ InGaAs). In FIG. 4B, the process patterns the P+ GaAsSb base 116, patterns the N—InP collector 114, performs a deposit of silicon nitride, and patterns collector contact 113.

At 814, the process deposits a dielectric. At 816, the process patterns vias and metals. For example, in FIG. 4C, the process adds the first ILD 102, and patterns additional ones of the metals 108 and the vias 109, resulting in the HBT wafer 403.

At 818, the process bonds a reconstituted CMOS wafer to the Si interposer. At 820, the process embeds passive components into the Si interposer. For example, in FIG. 4D, the process interconnects the HBT wafer 403 (of FIG. 4C) to the Si interposer 404 and then embeds the passive components. The HBT wafer 403 is a structure that uses InP and includes radio frequency front end (RFFE) components such as, for example, a power amplifier, a low noise amplifier, a varactor, and the like. The process interconnects 407 the Si interposer 404 to the reconstituted CMOS wafer 408. The reconstituted CMOS wafer 408 may include, for example, the SOI switch 310, the CMOS beamformer 312, the SOI switch 410, and the CMOS beamformer 412. The package substrate 454 is attached to the top surface of the HBT wafer 403. The antenna module 452 is attached to the top surface of the package substrate 454 and is connected to the sub-collector 112 (e.g., N+ InGaAs) of the HBT wafer 403 through the package substrate 454.

Figure 9:
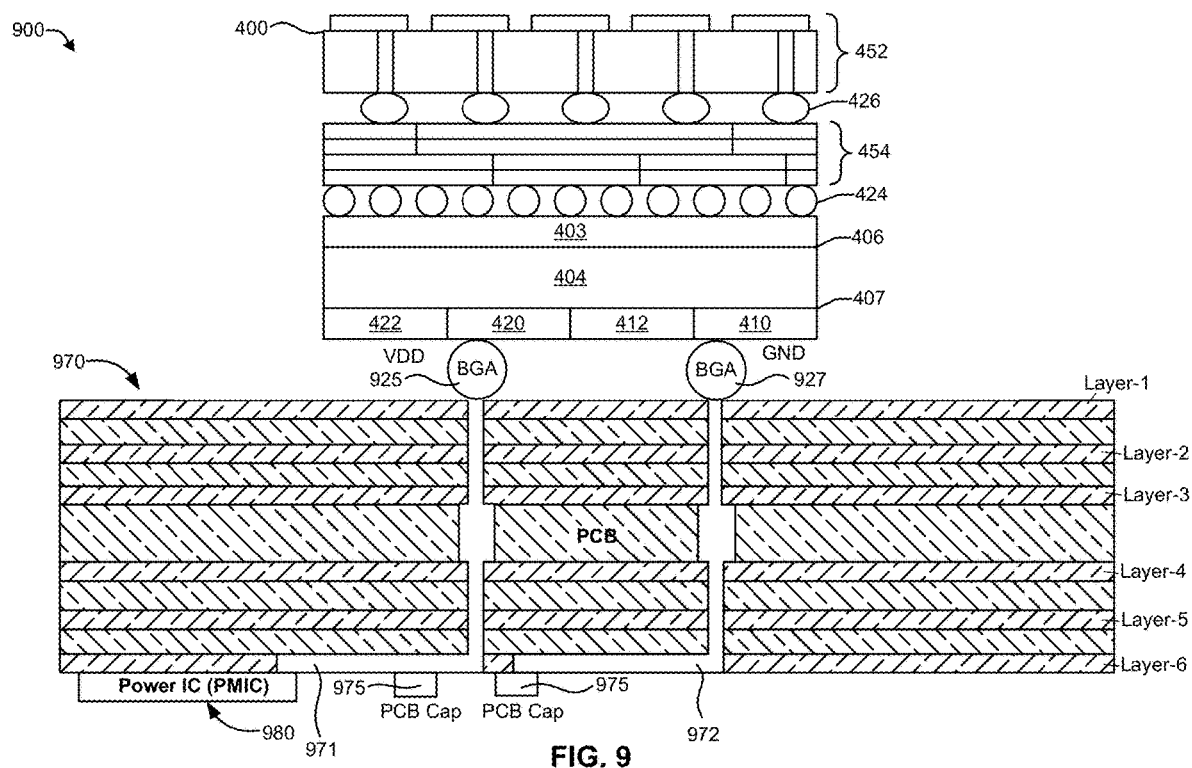
FIG. 9 illustrates components of an integrated device in accordance with one or more aspects of the disclosure.

FIG. 9 illustrates components of an integrated device 900 according to one or more aspects of the disclosure. Regardless of the various techniques discussed above, it will be appreciated that the semiconductor 400 (which may contain multiple dies/chiplets, etc.) may be configured to couple to a PCB 970. The PCB 970 is also coupled to a power supply 980 (e.g., a power management integrated circuit (PMIC)), which allows the the semiconductor 400 to be electrically coupled to the PMIC 980. Specifically, one or more power supply (VDD) lines 971 and one or more ground (GND) lines 972 may be coupled to the PMIC 980 to distribute power to the PCB 970, semiconductor 400 via VDD BGA pin 925 and GND BGA pin 927. The VDD line 971 and GND line 972 each may be formed from traces, shapes or patterns in one or more metal layers of the PCB 970 (e.g., layers 1-6) coupled by one or more vias through insulating layers separating the metal layers 1-6 in the PCB 970. The PCB 970 may have one or more PCB capacitors (PCB cap) 975 that can be used to condition the power supply signals, as is known to those skilled in the art. Additional connections and devices may be coupled to and/or pass through the PCB 970 to the semiconductor 400 via one or more additional BGA pins (not illustrated) on the semiconductor 400. It will be appreciated that the illustrated configuration and descriptions are provided merely to aid in the explanation of the various aspects disclosed herein. For example, the PCB 970 may have more or less metal and insulating layers, there may be multiple lines providing power to the various components, etc. Accordingly, the forgoing illustrative examples and associated figures should not be construed to limit the various aspects disclosed and claimed herein In accordance with the various aspects disclosed herein, at least one aspect includes a hetero-integrated HBT structure that is created using either a sacrificial wafer or an Si interposer. A technical advantage includes a hetero-integrated HBT structure in which the HBT has a base-collector junction that is about 30% smaller in area as compared to a conventional structure in which the collector contacts are on a same side as the emitter contacts and the base contacts. The reduction in the size of the base-collector junction is achieved by moving the collector contacts to an opposite side of the emitter contacts and the base contacts. Another technical advantage is that, by reducing the base-collector junction area, a power gain improvement of about 2 db is realized (e.g., compared to the conventional structure). The HBT structure described herein provides for a mesa on both the emitter side and the collector side and enables hetero-integration. For example, an Si interposer may be bonded on the emitter side with chiplets on the other side.

Other technical advantages will be recognized from various aspects disclosed herein and these technical advantages are merely provided as examples and should not be construed to limit any of the various aspects disclosed herein.

Figure 10:
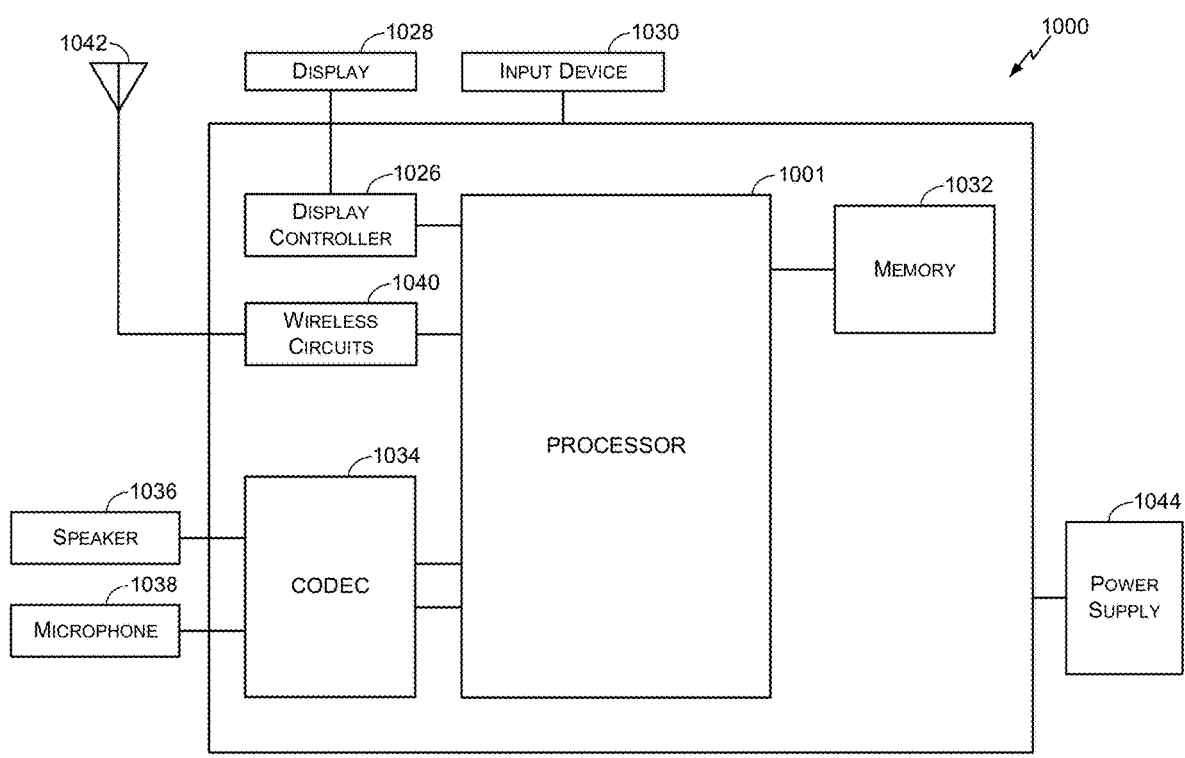
FIG. 10 illustrates an exemplary mobile device in accordance with one or more aspects of the disclosure.

FIG. 10 illustrates an exemplary mobile device 1000 in accordance with some examples of the disclosure. Referring now to FIG. 10, a block diagram of a mobile device that is configured according to exemplary aspects is depicted and generally designated mobile device 1000. In some aspects, mobile device 1000 may be configured as a wireless communication device. As shown, mobile device 1000 includes processor 1001.

Processor 1001 may be communicatively coupled to memory 1032 over a link, which may be a die-to-die or chip-to-chip link. Processor 1001 is a hardware device capable of executing logic instructions. Mobile device 1000 also includes display 1028 and display controller 1026, with display controller 1026 coupled to processor 1001 and to display 1028.

In some aspects, FIG. 10 may include coder/decoder (CODEC) 1034 (e.g., an audio and/or voice CODEC) coupled to processor 1001; speaker 1036 and microphone 1038 coupled to CODEC 1034; and wireless circuits 1040 (which may include a modem, RF circuitry, filters, etc., which may be implemented using hetero-integration with InP) coupled to wireless antenna 1042 and to processor 1001.

In a particular aspect, where one or more of the above-mentioned blocks are present, processor 1001, display controller 1026, memory 1032, CODEC 1034, and wireless circuits 1040 can be implemented in whole or part using the hetero-integration techniques disclosed herein. Input device 1030 (e.g., physical or virtual keyboard), power supply 1044 (e.g., battery), display 1028, input device 1030, speaker 1036, microphone 1038, wireless antenna 1042, and power supply 1044 may be external to device 1000 and may be coupled to a component of device 1000, such as an interface or a controller.

It should be noted that although FIG. 10 depicts a mobile device 1000, processor 1001 and memory 1032 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 11:
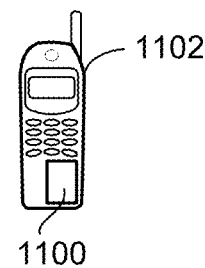
FIG. 11 illustrates various electronic devices that may be integrated with an integrated device or a semiconductor device in accordance with one or more aspects of the disclosure.
Figure 11:
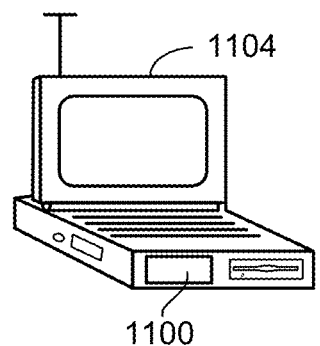
Figure 11:
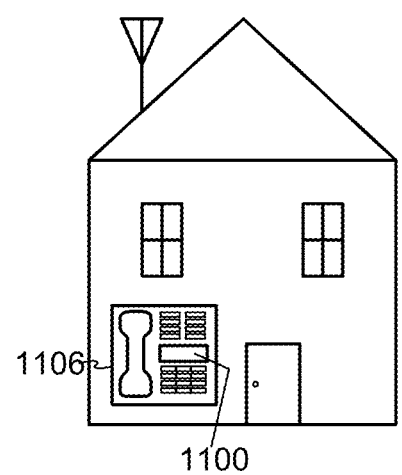

FIG. 11 illustrates various electronic devices that may be integrated with any of the aforementioned integrated device or semiconductor device accordance with various examples of the disclosure. For example, a mobile phone device 1102, a laptop computer device 1104, and a fixed location terminal device 1106 may each be considered generally user equipment (UE) and may include an electronic device 1100 including hetero-integration with an HBT structure (e.g., the integrated device 900 of FIG. 9), as described herein. The electronic device 1100 may be, for example, any of the integrated circuits, dies, integrated devices, integrated device packages, integrated circuit devices, device packages, integrated circuit (IC) packages, package-on-package devices described herein. The devices 1102, 1104, 1106 illustrated in FIG. 11 are merely exemplary. Other devices may also include electronic device 1100 having the hetero-integration with an HBT structure including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It can be noted that, although particular frequencies, integrated circuits (ICs), hardware, and other features are described in the aspects herein, alternative aspects may vary. That is, alternative aspects may utilize additional or alternative frequencies (e.g., other the 60 GHz and/or 28 GHz frequency bands), antenna elements (e.g., having different size/shape of antenna element arrays), scanning periods (including both static and dynamic scanning periods), electronic devices (e.g., WLAN APs, cellular base stations, smart speakers, IoT devices, mobile phones, tablets, personal computer (PC), etc.), and/or other features. A person of ordinary skill in the art will appreciate such variations.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

In view of the descriptions and explanations above, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause. Implementation examples are described in the following numbered clauses:

Clause 1. An apparatus comprising a heterojunction bipolar transistor comprising: a sub-collector disposed on a collector, the collector having a collector contact disposed on the sub-collector and located on a first side of the heterojunction bipolar transistor; an emitter disposed on an emitter cap, the emitter having an emitter contact disposed on the emitter cap and located on a second side of the heterojunction bipolar transistor; and a base having a base contact located on the second side of the heterojunction bipolar transistor.

Clause 2. The apparatus of clause 1, wherein: the heterojunction bipolar transistor comprises an epitaxial stack; and the epitaxial stack includes the collector, the emitter, and the base.

Clause 3. The apparatus of any of clauses 1 to 2, wherein the sub-collector comprises Indium Gallium Arsenide.

Clause 4. The apparatus of any of clauses 1 to 3, wherein the base comprises at least one of Gallium Arsenide Antimonide or Indium Gallium Arsenide.

Clause 5. The apparatus of any of clauses 1 to 4, wherein the emitter comprises Indium Phosphide.

Clause 6. The apparatus of any of clauses 1 to 5, wherein the collector comprises Indium Phosphide.

Clause 7. The apparatus of any of clauses 1 to 6, further comprising a silicon interposer.

Clause 8. The apparatus of clause 7, wherein the silicon interposer is coupled to the second side of the heterojunction bipolar transistor with a hybrid bond interface.

Clause 9. The apparatus of any of clauses 7 to 8, wherein one or more passive components are embedded in the silicon interposer.

Clause 10. The apparatus of any of clauses 7 to 9, wherein a plurality of radio frequency front end components are coupled to the silicon interposer.

Clause 11. The apparatus of clause 10, wherein the plurality of radio frequency front end components comprise at least one of: a variable gain amplifier; a component of a frequency synthesizer; a complementary metal oxide semiconductor low noise amplifier; a complementary metal oxide semiconductor beamformer; and a silicon-on-insulator switch.

Clause 12. The apparatus of any of clauses 7 to 11, wherein the silicon interposer is coupled to the heterojunction bipolar transistor via a plurality of solder balls.

Clause 13. The apparatus of any of clauses 1 to 12, further comprising: an antenna module coupled to the first side of the heterojunction bipolar transistor.

Clause 14. The apparatus of clause 13, wherein the antenna module comprises one or more antenna tiles and a package substrate.

Clause 15. The apparatus of any of clauses 1 to 14, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Clause 16. A method of fabricating a semiconductor device comprising a heterojunction bipolar transistor, the method comprising: forming a sub-collector; forming a collector on the sub-collector, the collector having a collector contact disposed on the sub-collector and located on a first side of the heterojunction bipolar transistor; forming an emitter; forming an emitter cap on the emitter, the emitter having an emitter contact disposed on the emitter cap and located on a second side of the heterojunction bipolar transistor; and forming a base having a base contact located on the second side of the heterojunction bipolar transistor.

Clause 17. The method of clause 16, further comprising: coupling, with a hybrid bond interface, a silicon interposer to the second side of the heterojunction bipolar transistor.

Clause 18. The method of clause 17, further comprising: hybrid bonding a complementary metal oxide semiconductor device to the silicon interposer.

Clause 19. The method of clause 18, wherein the complementary metal oxide semiconductor device comprises: at least one complementary metal oxide semiconductor beamformer; and at least one silicon-on-insulator (SOI) switch.

Clause 20. The method of any of clauses 17 to 19, further comprising: embedding one or more passive components into the silicon interposer.

Clause 21. The method of any of clauses 16 to 20, wherein: the heterojunction bipolar transistor comprises an epitaxial stack; and the epitaxial stack includes the collector, the emitter, and the base.

Clause 22. The method of any of clauses 16 to 21, further comprising: bonding a sacrificial wafer to the second side of the heterojunction bipolar transistor.

Clause 23. The method of clause 22, further comprising: debonding the sacrificial wafer from the second side of the heterojunction bipolar transistor; hetero-integrating the heterojunction bipolar transistor with one or more chiplets on the second side of the heterojunction bipolar transistor; and hetero-integrating the heterojunction bipolar transistor with one or more chiplets on the first side of the heterojunction bipolar transistor.

Clause 24. The method of any of clauses 16 to 23, wherein: the sub-collector comprises Indium Gallium Arsenide; the base comprises at least one of Gallium Arsenide Antimonide or Indium Gallium Arsenide; the emitter comprises Indium Phosphide; and the collector comprises Indium Phosphide.

Clause 25. The method of clause 16, further comprising: coupling, with a hybrid bond interface, a silicon interposer to the second side of the heterojunction bipolar transistor; and coupling, with a hybrid bond interface, a reconstituted complementary metal oxide semiconductor wafer to the silicon interposer, wherein one or more passive components are embedded into the silicon interposer, and wherein the reconstituted complementary metal oxide semiconductor wafer comprises a plurality of radio frequency front end components.

Clause 26. The method of any of clauses 16 to 25, wherein the semiconductor device is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

Accordingly, it will be appreciated, for example, that an apparatus or any component of an apparatus may be configured to (or made operable to or adapted to) provide functionality as taught herein. This may be achieved, for example: by manufacturing (e.g., fabricating) the apparatus or component so that it will provide the functionality; by programming the apparatus or component so that it will provide the functionality; or through the use of some other suitable implementation technique. As one example, an integrated circuit may be fabricated to provide the requisite functionality. As another example, an integrated circuit may be fabricated to support the requisite functionality and then configured (e.g., via programming) to provide the requisite functionality. As yet another example, a processor circuit may execute code to provide the requisite functionality.

Moreover, the methods, sequences, and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor (e.g., cache memory).

While the foregoing disclosure shows various illustrative aspects, it should be noted that various changes and modifications may be made to the illustrated examples without departing from the scope defined by the appended claims. The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. An apparatus comprising a semiconductor device that comprises a heterojunction bipolar transistor, the semiconductor device comprising:
   a sub-collector disposed on a collector;
   a collector contact disposed on an upper surface of the sub-collector;
   an emitter disposed on an emitter cap;
   an emitter contact disposed on a lower surface of the emitter cap;
   a base disposed between the collector and the emitter;
   a base contact disposed on a lower surface of the base and extending through the emitter;
   a first interconnection structure disposed under the emitter and the emitter cap, the first interconnection structure including a first conductive path formed of at least a via and electrically connecting the emitter contact to a first conductive layer on a lower surface of the first interconnection structure and including a second conductive path electrically connecting the base contact; and
   a second interconnection structure disposed over the base, the collector, and the sub-collector, the second interconnection structure including a third conductive path electrically connecting the collector contact to a second conductive layer on an upper surface of the second interconnection structure and including a fourth conductive path electrically connecting the second conductive path to the second conductive layer on the upper surface of the second interconnection structure,
   wherein the apparatus further comprises an interposer attached to the lower surface of the first interconnection structure, and
   wherein the interposer comprises a fifth conductive path electrically connecting the first conductive path through the first conductive layer.

2. The apparatus of claim 1, wherein:
   the semiconductor device comprises an epitaxial stack; and
   the epitaxial stack includes the collector, the emitter, and the base.

3. The apparatus of claim 1, wherein the sub-collector comprises Indium Gallium Arsenide.

4. The apparatus of claim 1, wherein the base comprises at least one of Gallium Arsenide Antimonide or Indium Gallium Arsenide.

5. The apparatus of claim 1, wherein the emitter comprises Indium Phosphide.

6. The apparatus of claim 1, wherein the collector comprises Indium Phosphide.

7. The apparatus of claim 1, wherein the interposer is a silicon interposer.

8. The apparatus of claim 7, wherein the silicon interposer is coupled to the lower surface of the first interconnection structure with a hybrid bond interface.

9. The apparatus of claim 7, wherein one or more passive components are embedded in the silicon interposer.

10. The apparatus of claim 7, wherein a plurality of radio frequency front end components are coupled to the silicon interposer.

11. The apparatus of claim 10, wherein the plurality of radio frequency front end components comprise at least one of:
    a variable gain amplifier;
    a component of a frequency synthesizer;
    a complementary metal oxide semiconductor low noise amplifier;
    a complementary metal oxide semiconductor beamformer; and
    a silicon-on-insulator switch.

12. The apparatus of claim 7, wherein the silicon interposer is coupled to the semiconductor device via a plurality of solder balls.

13. The apparatus of claim 1, further comprising:
    an antenna module coupled to the upper surface of the second interconnection structure.

14. The apparatus of claim 13, wherein the antenna module comprises one or more antenna tiles and a package substrate.

15. The apparatus of claim 1, wherein the apparatus is selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

16. A method of fabricating a semiconductor device comprising a heterojunction bipolar transistor, the method comprising:
- forming an emitter, an emitter cap, and an emitter contact, the emitter being on the emitter cap, and the emitter contact being disposed on a lower surface of the emitter cap;
- forming a base contact extending through the emitter;
- forming a first interconnection structure that is under the emitter and the emitter cap, the first interconnection structure including a first conductive path formed of at least a via and electrically connecting the emitter contact to a first conductive layer on a lower surface of the first interconnection structure and including a second conductive path electrically connecting the base contact;
- forming a base over the emitter, the base contact being disposed on a lower surface of the base;
- forming a collector over the base;
- forming a sub-collector over the collector;
- forming a collector contact disposed on an upper surface of the sub-collector;
- forming a second interconnection structure that is over the base, the collector, and the sub-collector, the second interconnection structure including a third conductive path electrically connecting the collector contact to a second conductive layer on an upper surface of the second interconnection structure and including a fourth conductive path electrically connecting the second conductive path to the second conductive layer on the upper surface of the second interconnection structure; and
- attaching an interposer to the lower surface of the first interconnection structure,
- wherein the interposer comprises a fifth conductive path electrically connecting the first conductive path through the first conductive layer.

17. The method of claim 16, wherein:
the interposer is a silicon interposer, and
the silicon interposer is coupled to the lower surface of the first interconnection structure with a hybrid bond interface.

18. The method of claim 17, further comprising:
hybrid bonding a complementary metal oxide semiconductor device to the silicon interposer.

19. The method of claim 18, wherein the complementary metal oxide semiconductor device comprises:
at least one complementary metal oxide semiconductor beamformer; and
at least one silicon-on-insulator (SOI) switch.

20. The method of claim 17, further comprising:
embedding one or more passive components into the silicon interposer.

21. The method of claim 16, wherein:
the semiconductor device comprises an epitaxial stack; and
the epitaxial stack includes the collector, the emitter, and the base.

22. The method of claim 16, further comprising:
bonding a sacrificial wafer to the lower surface of the first interconnection structure.

23. The method of claim 22, further comprising:
debonding the sacrificial wafer from the lower surface of the first interconnection structure;
hetero-integrating the semiconductor device with one or more chiplets on the lower surface of the first interconnection structure; and
hetero-integrating the semiconductor device with one or more chiplets on the upper surface of the second interconnection structure.

24. The method of claim 16, wherein:
the sub-collector comprises Indium Gallium Arsenide;
the base comprises at least one of Gallium Arsenide Antimonide or Indium Gallium Arsenide;
the emitter comprises Indium Phosphide; and
the collector comprises Indium Phosphide.

25. The method of claim 16, wherein the attaching the interposer to the lower surface of the first interconnection structure comprises:
coupling, with a hybrid bond interface, the interposer that is a silicon interposer to the lower surface of the first interconnection structure; and
coupling, with a hybrid bond interface, a reconstituted complementary metal oxide semiconductor wafer to the silicon interposer,
wherein one or more passive components are embedded into the silicon interposer, and wherein the reconstituted complementary metal oxide semiconductor wafer comprises a plurality of radio frequency front end components.

26. The method of claim 16, wherein the semiconductor device is incorporated into an apparatus selected from the group consisting of: a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, a base station, and a device in an automotive vehicle.

* * * * *